(12) United States Patent
Shimizu et al.

(10) Patent No.: US 12,240,747 B2
(45) Date of Patent: *Mar. 4, 2025

(54) PARTICLE EXTRACTION APPARATUS AND PARTICLE EXTRACTION METHOD

(71) Applicant: Sony Group Corporation, Tokyo (JP)

(72) Inventors: Tatsuo Shimizu, Chiba (JP); Kazuya Takahashi, Kanagawa (JP); Yu Hirono, Tokyo (JP)

(73) Assignee: Sony Group Corporation, Tokyo (JP)

( * ) Notice: Subject to any disclaimer, the term of this patent is extended or adjusted under 35 U.S.C. 154(b) by 433 days.

This patent is subject to a terminal disclaimer.

(21) Appl. No.: 17/548,962

(22) Filed: Dec. 13, 2021

(65) Prior Publication Data

US 2022/0098027 A1    Mar. 31, 2022

Related U.S. Application Data

(63) Continuation of application No. 16/099,511, filed as application No. PCT/JP2017/006503 on Feb. 22, 2017, now Pat. No. 11,254,557.

(30) Foreign Application Priority Data

May 17, 2016   (JP) .................................. 2016-098927

(51) Int. Cl.
*B81B 1/00* (2006.01)
*B01L 3/00* (2006.01)
(Continued)

(52) U.S. Cl.
CPC .............. *B81B 1/006* (2013.01); *B01L 3/502* (2013.01); *B81B 1/00* (2013.01); *G01N 15/1023* (2024.01);
(Continued)

(58) Field of Classification Search
CPC ............... G01N 15/1023; G01N 15/14; G01N 15/1484; G01N 15/149; G01N 2015/1006; B81B 1/006; B01L 3/502

See application file for complete search history.

(56) References Cited

U.S. PATENT DOCUMENTS 5,489,506 A    2/1996   Crane
6,281,018 B1 *  8/2001   Kirouac ................. G01N 15/14
                                                                436/63

(Continued)

FOREIGN PATENT DOCUMENTS

CN    102019277 A    4/2011
CN    103415617 A    11/2013

(Continued)

OTHER PUBLICATIONS

U.S. Appl. No. 16/099,511, filed Nov. 7, 2018, Shimizu et al.

(Continued)

*Primary Examiner* — Natalie Huls
(74) *Attorney, Agent, or Firm* — Wolf, Greenfield & Sacks, P.C.

(57) ABSTRACT

Provided is microparticle extraction technology capable of stably extracting only a target microparticle at high speed from a sheath flow flowing through a flow path.

A particle extraction apparatus includes: a first extraction unit for extracting, from a whole sample containing a target particle, an extraction sample containing the target particle without performing abort processing; and a second extraction unit for subjecting the extraction sample to abort processing and extracting only the target particle.

14 Claims, 12 Drawing Sheets

(51) Int. Cl.
    *G01N 15/10*     (2024.01)
    *G01N 15/14*     (2024.01)
    *G01N 15/149*     (2024.01)
    *G01N 37/00*     (2006.01)

(52) U.S. Cl.
    CPC ......... *G01N 15/14* (2013.01); *G01N 15/1459* (2013.01); *G01N 15/1484* (2013.01); *G01N 37/00* (2013.01); *G01N 2015/1006* (2013.01); *G01N 15/149* (2024.01)

(56) References Cited

U.S. PATENT DOCUMENTS

| | | | |
|---|---|---|---|
| 7,258,774 B2 | 8/2007 | Chou et al. | |
| 8,795,500 B2 | 8/2014 | Shinoda | |
| 11,254,557 B2 | 2/2022 | Shimizu et al. | |
| 2003/0170609 A1* | 9/2003 | Rigler | G01N 15/14 435/7.1 |
| 2005/0211557 A1* | 9/2005 | Childers | B03C 5/005 204/547 |
| 2006/0177348 A1* | 8/2006 | Yasuda | B01L 3/502715 422/73 |
| 2007/0065808 A1* | 3/2007 | Bohm | B01L 3/502761 435/6.16 |
| 2012/0275955 A1* | 11/2012 | Haghgooie | A61B 5/150099 210/321.62 |
| 2012/0277902 A1* | 11/2012 | Sharpe | G01N 15/1404 209/132 |
| 2012/0307244 A1 | 12/2012 | Sharpe et al. | |
| 2014/0102948 A1* | 4/2014 | Jung | H04N 13/32 209/12.2 |
| 2014/0299522 A1* | 10/2014 | Ito | F16K 99/0001 209/577 |
| 2014/0339101 A1* | 11/2014 | Shen | G01N 27/4163 205/792 |
| 2015/0050688 A1 | 2/2015 | Thrasher et al. | |
| 2015/0111195 A1* | 4/2015 | Hamman | A61L 33/0094 418/268 |
| 2015/0328637 A1 | 11/2015 | Perrault, Jr. et al. | |
| 2015/0352599 A1* | 12/2015 | Deshpande | F16K 99/0001 209/552 |
| 2016/0139024 A1 | 5/2016 | Kim | |
| 2017/0336312 A1 | 11/2017 | Stoeber et al. | |
| 2019/0084011 A1 | 3/2019 | Imai et al. | |
| 2019/0144262 A1 | 5/2019 | Shimizu et al. | |
| 2019/0195765 A1 | 6/2019 | Chen et al. | |
| 2019/0217296 A1 | 7/2019 | Patel et al. | |
| 2020/0072732 A1 | 3/2020 | Hashimoto et al. | |

FOREIGN PATENT DOCUMENTS

| | | |
|---|---|---|
| CN | 104096687 A | 10/2014 |
| CN | 104204768 A | 12/2014 |
| EP | 1 688 732 A2 | 8/2006 |
| JP | 2002-505422 A | 2/2002 |
| JP | 2006220423 A | 8/2006 |
| JP | 2009-145213 A | 7/2009 |
| JP | 2014-036604 A | 2/2014 |
| JP | 2014-202573 A | 10/2014 |
| JP | 2015-507204 A | 3/2015 |
| WO | WO 1999/044035 A1 | 9/1999 |
| WO | WO 2002/001189 A1 | 1/2002 |
| WO | WO 2004/025266 A2 | 3/2004 |
| WO | WO 2013/119924 A1 | 8/2013 |
| WO | WO 2016/031486 A1 | 3/2016 |
| WO | WO-2017199506 A | 11/2017 |

OTHER PUBLICATIONS

International Search Report and English translation thereof mailed Apr. 18, 2017 in connection with International Application No. PCT/JP2017/006503.
International Written Opinion and English translation thereof mailed Apr. 18, 2017 in connection with International Application No. PCT/JP2017/006503.
International Preliminary Report on Patentability and English translation thereof mailed Nov. 29, 2018 in connection with International Application No. PCT/JP2017/006503.
Extended European Search Report issued Mar. 28, 2019 in connection with European Application No. 17798944.9.
Chinese Office Action issued Sep. 9, 2020 in connection with Chinese Application No. 201780028360.4, and English translation thereof.
Baghbaderani et al., cGMP-Manufactured Human Induced Pluripotent Stem Cells are Available for Pre-clinical and Clinical Applications, Stem Cell Reports, Oct. 13, 2015, vol. 5, pp. 647-659.
Sommermeyer et al., Chimeric antigen receptor-modified T cells derived from defined CD8+ and CD4+ subsets confer superior antitumor reactivity in vivl, Leukemia, Feb. 2016, v30(2), pp. 492-500.
Extended European Search Report issued Feb. 16, 2022 in connection with European Application No. 21207945.3.

* cited by examiner

PARTICLE EXTRACTION APPARATUS AND PARTICLE EXTRACTION METHOD

This application is a continuation of and claims the benefit under 35 U.S.C. § 120of U.S. patent application Ser. No. 16/099511, titled "PARTICLE EXTRACTION APPARATUS AND PARTICLE EXTRACTION METHOD," filed Nov. 7, 2018, now U.S. Pat. No. 11,254,557, which is a National Stage of International Application No. PCT/JP2017/006503, filed in the Japanese Patent Office as a Receiving office on Feb. 22, 2017, which claims priority to Japanese Patent Application Number JP2016-098927, filed in the Japanese Patent Office on May 17, 2016.

TECHNICAL FIELD

The present technology relates to a particle extraction apparatus and a particle extraction method. More specifically, the present technology relates to a particle extraction apparatus and the like capable of stably extracting only a target microparticle at high speed from a sheath flow flowing through a flow path.

BACKGROUND ART

As this type of particle extraction apparatus, for example, a microparticle extraction apparatus for forming a sheath flow containing a microparticle in a flow path, irradiating the microparticle in the sheath flow with light to detect fluorescence and scattered light generated from the microparticle, and separating and recovering a microparticle group exhibiting predetermined optical characteristics is known. For example, with a flow cytometer, by labeling a plurality of kinds of cells contained in a sample with a fluorescent dye and optically identifying the fluorescent dye labeled to each of the cells, only specific kinds of cells are separated and recovered.

As the flow cytometer, a so-called droplet charging type for making a fluid discharged from a flow cell, a microchip, or the like into a droplet, applying a plus (+) or minus (-) charge to the droplet, and extracting a target particle as disclosed in Patent Document 1, and a micro flow path type for performing extraction in a microchip as disclosed in Patent Document 2 are known, for example.

Such technology of the flow cytometer is expected to be utilized as a clinical application in the field of, for example, immune cell therapy. An extraction apparatus which can cope with aseptic conditions, is easily handled, and can extract a target cell with high purity at high speed is required. (Non-Patent Documents 1 and 2)

CITATION LIST

Patent Document

Patent Document 1: Japanese Patent Application Laid-Open No. 2009-145213
Patent Document 2: Japanese Patent Application Laid-Open No. 2014-036604

Non-Patent Document

Non-Patent Document 1: Leukemia (2016) 30, 492-500; doi:10.1038/leu.2015.247; published online 6 Oct. 2015
Non-Patent Document 2: Baghbaderani et al., cGMP-Manufactured Human Induced Pluripotent Stem Cells Are Available for Preclinical and Clinical Applications, Stem Cell Reports (2015), http://dx.doi.org/10.1016/j.stemcr.2015.08.015

SUMMARY OF THE INVENTION

Problems to be Solved by the Invention

However, in conventional particle extraction technology, when extraction is performed, a liquid and particles present in a certain finite volume are taken in together. Therefore, in a case where it is attempted to extract a target particle, if a distance between the target particle and a particle spatially adjacent thereto is small, a possibility that the adjacent particle will be taken in together increases. Therefore, in order to extract a target particle at high speed in the flow cytometer, a probability that a non-target particle is taken in together with the target particle increases, and a ratio (also referred to as "purity") of the target particle with respect to an extracted whole sample decreases disadvantageously.

In addition, in a case where reduction in purity is not allowable, even if a particle with a short passage time interval with an adjacent particle is a target particle, it is necessary to determine not to perform extraction in a processing system (hereinafter also referred to as "abort"), a ratio (also referred to as "yield") of the number of extracted target particles with respect to the number of input target particles is reduced, and as a result, extraction cannot be performed at high speed disadvantageously.

Furthermore, as a means for performing extraction of a particle at high speed, a method for simultaneously driving a plurality of extraction mechanisms disposed in parallel is considered. However, in addition to a sheath forming unit, for example, an excitation optical system for exciting a fluorescent dye of a dyed particle, a detection system for detecting fluorescence, an electrical system for converting detected light into an electric signal with a photoelectric conversion element and amplifying and digitizing the electric signal, a processing system for determining whether extraction is performed on the basis of the signal, and the like are required in proportion to the parallel number of the extraction mechanisms. This brings an increase in size of a particle extraction apparatus and an increase in cost disadvantageously.

Solutions to Problems

The present technology provides a particle extraction apparatus including: a first extraction unit for extracting, from a whole sample containing a target particle, an extraction sample containing the target particle without performing abort processing; and a second extraction unit for subjecting the extraction sample to abort processing and extracting only the target particle.

In the particle extraction apparatus according to the present technology, the first extraction unit and the second extraction unit may be formed as separate members, and after extraction by the first extraction unit, extraction by the second extraction unit may be performed.

In addition, in the particle molecular apparatus according to the present technology, the first extraction unit and the second extraction unit may be formed as the same member, and after extraction by the first extraction unit, extraction by the second extraction unit may be performed.

In addition, the particle molecular apparatus according to the present technology may include a stirring unit for returning a particle interval in an extraction sample extracted by the first extraction unit to a random state.

In addition, the particle molecular apparatus according to the present technology may include: a measurement unit for measuring a ratio of a target particle with respect to the whole sample; and an extraction switching unit for switching an extraction operation by the first extraction unit and an extraction operation by the second extraction unit to a parallel operation on the basis of a measurement result by the measurement unit.

The present technology also provides a particle extraction method including: a first extraction step of extracting, from a whole sample containing a target particle, an extraction sample containing the target particle without performing abort processing; and a second extraction step of subjecting the extraction sample to abort processing and extracting only the target particle.

The particle extraction method according to the present technology may include a stirring step of returning a particle interval in the extraction sample to a random state after the first extraction step is performed.

In addition, the particle extraction method according to the present technology may further include an extraction switching step of performing the first extraction step and the second extraction step in parallel on the basis of a ratio of a target particle with respect to the whole sample.

Furthermore, the present technology also provides a particle extraction microchip including: a first extraction unit for extracting, from a whole sample containing a target particle, an extraction sample containing the target particle without performing abort processing; and a second extraction unit for subjecting the extraction sample to abort processing and extracting only the target particle.

In the present technology, the "target particle" widely includes a living body-related microparticle such as a cell, a microorganism, or a liposome, and a synthetic particle such as a latex particle, a gel particle, or an industrial particle.

The living body-related microparticle includes a chromosome, a liposome, a mitochondria, an organelle, and the like constituting various cells. The cells include an animal cell (such as a hemocyte cell) and a plant cell. The microorganism includes bacteria such as *Escherichia coli*, viruses such as tobacco mosaic virus, fungi such as yeast, and the like. Furthermore, the living body-related microparticle can also include a living body-related polymer such as a nucleic acid, a protein, or complexes thereof. In addition, the industrial particles may be, for example, an organic or inorganic polymer material or a metal. The organic polymer material includes polystyrene, styrene-divinylbenzene, polymethyl methacrylate, and the like. The inorganic polymer material includes glass, silica, a magnetic material, and the like. The metal includes gold colloid, aluminum, and the like. The shape of each of these microparticles is generally spherical but may be non-spherical, and the size, mass, and the like thereof are not particularly limited, either.

Effects of the Invention

The present technology provides microparticle extraction technology capable of stably extracting only a target microparticle at high speed from a sheath flow flowing through a flow path.

Note that the effects described herein are not necessarily limited, and may be any of the effects described in the present technology.

MODE FOR CARRYING OUT THE INVENTION

Figure 1:
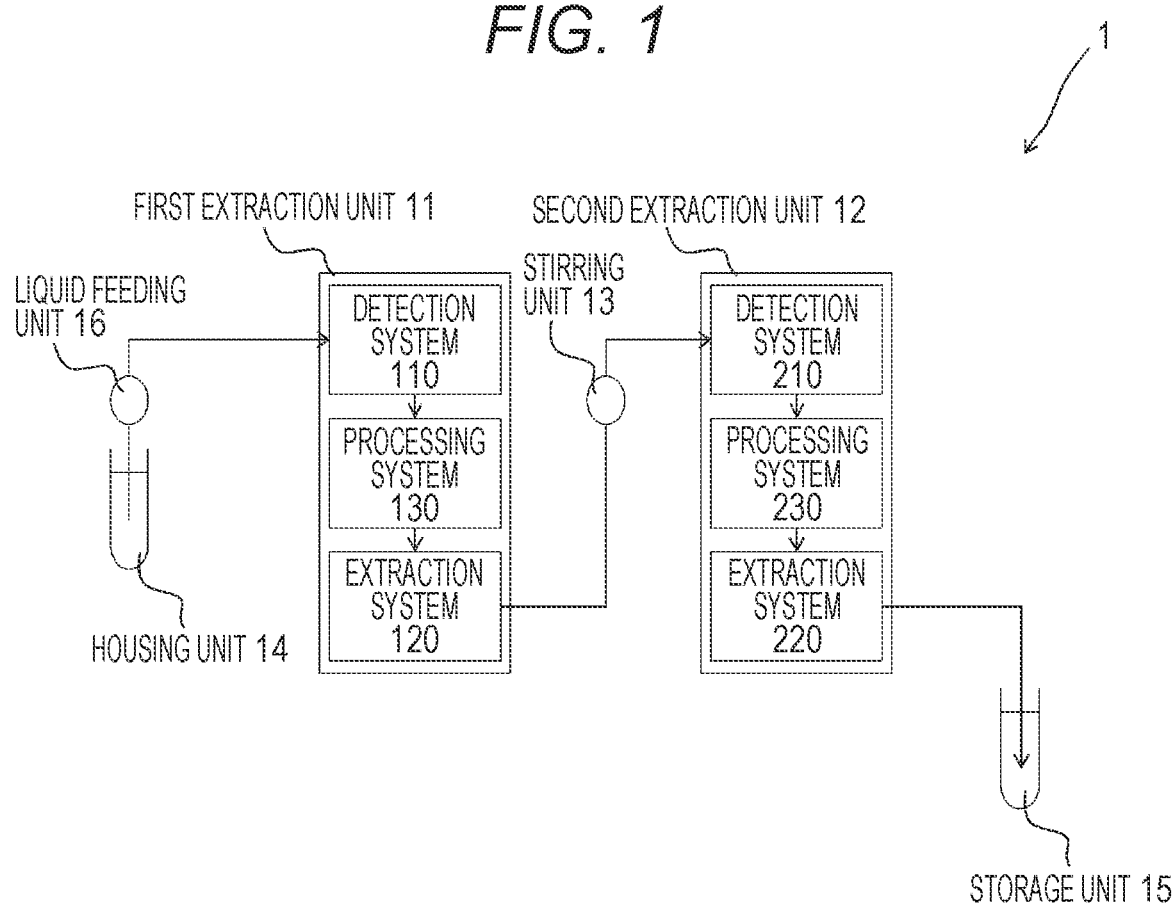
FIG. 1 is a schematic conceptual diagram schematically illustrating a concept of a first embodiment of a particle extraction apparatus according to the present technology.

Hereinafter, preferred embodiments for carrying out the present technology will be described with reference to the drawings. The embodiments described below exemplify representative embodiments of the present technology, and the scope of the present technology is not narrowly interpreted by the embodiments. Note that the description will be made in the following order.

1. Particle extraction apparatus according to first embodiment
   (1) Housing unit
   (2) Liquid feeding unit
   (3) First extraction unit
   (3-1) Detection system
   (3-2) Processing system
   (3-3) Extraction system
   (4) Stirring unit
   (5) Second extraction unit
   (5-1) Extraction system
   (6) Storage unit
2. Particle extraction apparatus according to second embodiment
   (1) First valve
   (2) Second valve
   (3) Extraction sample housing unit
3. Particle extraction apparatus according to third embodiment
   (1) First valve
   (2) Second valve
   (3) Third valve
   (4) Fourth valve
4. Particle extraction microchip according to first embodiment
   (1) First extraction section
   (2) Liquid feeding section
   (3) Second extraction section
5. Particle extraction method according to first embodiment
   (1) Whole sample inflow step
   (2) First extraction step
   (3) Stirring step
   (4) Second extraction step
   (5) Target particle storing step
6. Particle extraction method according to second embodiment <1. Particle Extraction Apparatus According to First Embodiment>

A first embodiment of a particle extraction apparatus according the present technology will be described with reference to FIGS. 1 to 6.

A particle extraction apparatus 1 according to the present technology includes at least a first extraction unit 11 and a second extraction unit 12. In addition, the particle extraction apparatus 1 may include a stirring unit 13, a housing unit 14, a storage unit 15, and a liquid feeding unit 16 as necessary. Each of the units will be described below according to the order in which a particle flows. The particle extraction apparatus 1 performs two extraction operations including extraction by the first extraction unit 11 and extraction by the second extraction unit 12. Incidentally, in the particle extraction apparatus 1 according to the present technology, the number of extraction is not particularly limited as long as two or more extraction units are included.

(1) Housing Unit

The particle extraction apparatus 1 according to the present technology includes the housing unit 14. The housing unit 14 houses a whole sample containing a target particle as an extraction target. The configuration of the housing unit 14 is not particularly limited, and can be appropriately changed depending on a storage environment condition of a target particle, a usage environment of a particle extraction apparatus, and the like, and a known structure can be adopted. For example, in a case where it is necessary to isolate a target particle from an external atmosphere, various structures such as a structure in which a check valve or the like is provided to prevent another sample from entering from the outside and a container structure in which an external atmosphere such as a test tube is in contact with a whole sample are considered.

(2) Liquid Feeding Unit

The particle extraction apparatus 1 according to the present technology may include the liquid feeding unit 16 as necessary. The liquid feeding unit 16 allows a whole sample housed in the housing unit 14 to flow into the first extraction unit 11. As the structure of the liquid feeding unit 16, a known structure can be adopted as long as the whole sample can be sent out to the first extraction unit 11.

For example, in a case where a tubular member (tube or the like) is connected to the housing unit 14 and the whole sample is fed to the first extraction unit 11 via the tubular member, as the configuration of the liquid feeding unit 16, a known liquid feeding pump or the like is considered.

(3) First Extraction Unit

The particle extraction apparatus 1 according to the present technology includes the first extraction unit 11 for extracting a target sample from the whole sample. The first extraction unit 11 includes a detection system 110 for detecting a target particle from the whole sample, an extraction system 120 for extracting the target particle on the basis of a detection result of the detection system 110, and a processing system 130 for converting detected optical information into electric information. Each of the systems will be described below.

(3-1) Detection System

In the first extraction unit 11 according to the present technology, the whole sample is sent out to the detection system 110 by the liquid feeding unit 16.

In this detection system 110, for example, a sample flow path into which the whole sample flows and a sheath liquid flow path into which a sheath liquid flows are formed, and a sheath flow containing a target particle is formed in the flow path.

In addition, the detection system 110 includes a labeling unit (not illustrated) for labeling the target particle in the sheath flow with a fluorescent dye, an irradiation unit (not illustrated) for irradiating the whole sample in the sheath flow with excitation light, and a light detection unit (not illustrated) for detecting fluorescence and/or scattered light emitted from the target particle by irradiation with light by the irradiation unit.

The configuration of the labeling unit is not particularly limited, and a known configuration can be adopted. In addition, the kind and the number of the fluorescent dye with which the labeling unit labels the target particle are not particularly limited, and a known dye such as fluorescein isothiocyanete (FITC: $C_{21}H_{11}NO_5S$), phycoerythrin (PE), periidininchlorophyll protein (PerCP), PE-Cy5, or PE-Cy7 can be appropriately selected to be used as necessary. Furthermore, each extraction target sample may be modified with a plurality of fluorescent dyes.

In addition, the configuration of the irradiation unit is not particularly limited, and a known configuration can be adopted. A light source included in the irradiation unit is not particularly limited, and examples thereof include a semiconductor laser, that is, a laser diode, a solid laser, and a gas laser. Among these light sources, by using the semiconductor laser, an apparatus can be small at low cost.

In addition, the wavelength of light emitted from the irradiation unit is not particularly limited, and can be appropriately changed depending on the kind of the target particle. For example, in a case where the target particle is a cell, a wavelength of 300 nm or less may damage the target particle, and therefore it is preferable not to use the wavelength of 300 nm or less.

Furthermore, the configuration of the light detection unit is not particularly limited, and a known configuration can be adopted. This light detection unit detects fluorescence and/or scattered light emitted from the target particle, and converts an optical signal thereof into an electric signal. This signal conversion method is not particularly limited, and a known method can be used. Then, the electric signal detected by the light detection unit is output to the processing system 130.

(3-2) Processing System

The processing system 130 in the first extraction unit 11 determines optical characteristics of an extraction sample extracted by the extraction system 120 on the basis of the input electric signal. Then, extraction information is output to the extraction system 120 such that an extraction sample containing a target particle is extracted by the extraction system 120 depending on the optical characteristics. Meanwhile, discarding information is output to the extraction system 120 such that a sample not containing a target particle is discarded.

The configuration of the processing system 130 is not particularly limited, and the processing system 130 may be constituted by a hard disk in which a program for executing output processing of the extraction information and discarding information and an OS are stored, a CPU, and a memory.

(3-3) Extraction System

The extraction system 120 in the first extraction unit 11 extracts an extraction sample containing a target particle from a whole sample on the basis of the information output from the processing system 130.

Figure 2:
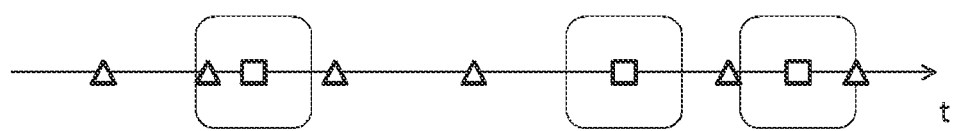
FIG. 2 is a schematic conceptual diagram schematically illustrating extraction processing in a first extraction unit included in the particle extraction apparatus illustrated in FIG. 1.
Figure 2:
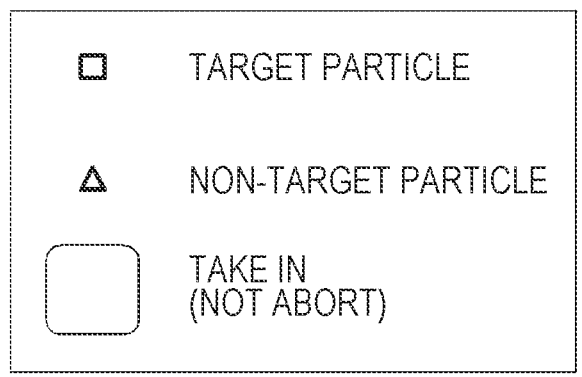

Specifically, description will be made with reference to FIG. 2. In FIG. 2, the lateral direction indicates a time axis t through which a whole sample flows, the square indicates a target particle, and the triangle indicates a non-target particle. As illustrated in FIG. 2, in the extraction system 120 of the first extraction unit 11, even in a case where not only a target particle but also a non-target particle is present adjacent to the target particle while a whole sample flows, an extraction sample containing the non-target particle and the target particle is extracted without performing abort processing (determination that extraction will not be performed).

An extraction method by the extraction system 120 is not particularly limited, and a known method can be adopted as long as an extraction sample containing a target particle is extracted without performing abort processing.

(4) Stirring Unit

The particle extraction apparatus 1 according to the present technology may include the stirring unit 13 as necessary.

The stirring unit 13 is disposed between the first extraction unit 11 and the second extraction unit 12, and changes a particle interval in the extraction sample. Specifically, the stirring unit 13 returns the particle interval in the extraction sample extracted by the first extraction unit 11 to a random state as in the case of the whole sample. Then, the extraction sample in which a particle interval is in a random state is fed to the second extraction unit 12.

The configuration of the stirring unit 13 is not particularly limited, and a known stirrer or the like can be adopted. In a case where the first extraction unit 11 and the second extraction 12 are connected with a tubular member and an extraction sample flows inside the tubular member, examples of the stirring unit 13 include a so-called peristaltic dosing pump. A configuration in which this peristaltic dosing pump compresses and relaxes the tubular member is considered.

Incidentally, a method for stirring the extraction sample is not particularly limited, and a known method can be adopted. Examples thereof include a method for applying pressure to the extraction sample.

(5) Second Extraction Unit

The particle extraction apparatus 1 according to the present technology includes the second extraction unit 12 for extracting a target particle from the extraction sample. This second extraction unit 12 includes a detection system 210 for detecting a target particle from an extraction sample, an extraction system 220 for extracting a target particle on the basis of a detection result of the detection system 210, and a processing system 230 for converting a detected optical signal into an electric signal. Each of the systems will be described below.

Note that the detection system 210 has the same configuration as that of the detection system 110 of the first extraction unit 11 except that a detection target is an extraction sample, and therefore description thereof will be omitted. In addition, the configuration of the processing system 230 is also the same as that of the processing system 130 of the first extraction unit 11, and therefore description thereof will be omitted.

(5-1) Extraction System

The extraction system 220 in the second extraction unit 12 extracts a target particle from an extraction sample on the basis of information output from the processing system 230.

Figure 3:
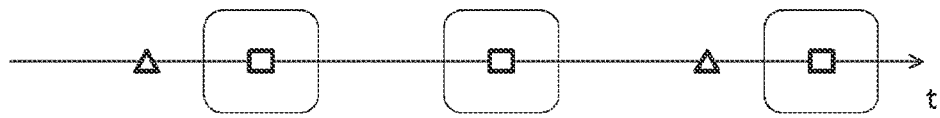
FIG. 3 is a schematic conceptual diagram schematically illustrating extraction processing in a second extraction unit included in the particle extraction apparatus illustrated in FIG. 1.
Figure 3:
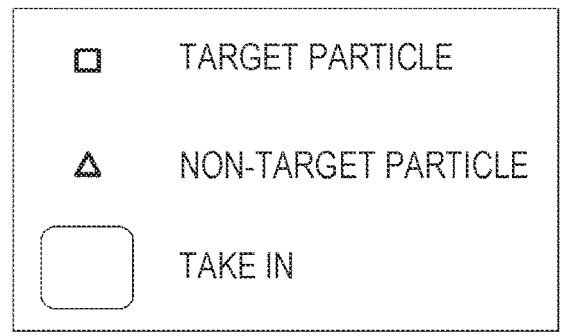

Specifically, description will be made with reference to FIG. 3. In FIG. 3, the lateral direction indicates a time axis t through which a whole sample flows, the square indicates a target particle, and the triangle indicates a non-target particle. As illustrated in FIG. 3, unlike the extraction system 120 of the first extraction unit 11, the extraction system 220 extracts only a target particle, and performs abort processing in a case of recognizing a non-target particle.

Incidentally, an extraction method by the extraction system 220 is not particularly limited, and a known method can be adopted as long as only a target particle is extracted.

(6) Storage Unit

The particle extraction apparatus 1 according to the present technology may include a storage unit 16 as necessary.

This storage unit 16 stores only a target particle extracted by the second extraction unit 12.

The configuration of the storage unit 16 is not particularly limited, and can be appropriately changed depending on a storage environment condition of a target particle, a usage environment of a particle extraction apparatus, and the like, and a known structure can be adopted. For example, in a case where there is a condition that a target particle is easily damaged by an external environment, examples of the configuration of the storage unit 16 include a closed container in which a stored target particle is not in contact with an external atmosphere.

In the particle extraction apparatus 1 according to the present technology as described above, for example, two extraction operations are performed by the first extraction unit 11 and the second extraction unit 12. Finally, a recovery ratio of a target particle (hereinafter also referred to as "yield") needs to be equal to or larger than a desired value.

Therefore, in the particle extraction apparatus 1 according to the present technology, the number of detection of a whole sample per unit time at the time of the extraction operation by the first extraction unit 11 is desirably set in relation to a final desired recovery ratio Ys of a target particle.

Specifically, for example, one mode is considered in which a detection number λ of a whole sample per unit time in the first extraction unit 11 is set within a range satisfying the following Mathematical Formula 1.

$$Y_{Cascode} = R \cdot 1 + \lambda_T T_P/2/1 + \lambda_T (T_P/2 + T_D) \cdot R \cdot 1 + \lambda_{T2} T_P/2/1 + \lambda_{T2}(T_P/2 + T_D) + (1 - e^{-\lambda_{U2} T_P} \geq Y_S$$ [Mathematical Formula 1]

$$Y_{Cascade} = R \cdot \frac{1 + \lambda_T T_P/2}{1 + \lambda_T(T_P/2 + T_D)} \cdot$$ [Mathematical Formula 1]

$$R \cdot \frac{(1 + \lambda_{T2} T_P/2)}{(1 + \lambda_{T2}(T_P/2 + T_D)) + (1 - e^{-\lambda_{U2} T_P})/e^{-\lambda_{U2} T_P}} \geq Y_S$$

Hereinafter, a method for calculating Mathematical Formula 1 will be described with reference to FIGS. 4 to 6.

Here, as described above, the particle extraction apparatus 1 according to the present technology forms a sheath flow to extract a target particle and constitutes a so-called flow cytometer.

A performance index of this flow cytometer is defined as illustrated in the following Table 1.

TABLE 1

| Item | Symbol | Definition |
| --- | --- | --- |
| Event Rate | λ | detection number of a whole sample per unit time |
| Yield | Y | recovery ratio with respect to a whole sample to be extracted |
| Efficiency | E | extraction efficiency for a detected target particle |
| Recovery | R | recovery ratio of a particle that has been extracted |
| Purity | P | ratio of a target particle in an extraction sample |

Hereinafter, each parameter for deriving Mathematical Formula 1 will be described on the basis of the definitions illustrated in Table 1.

That is, it is generally known that in a flow cytometer, the number of particles passing through a detection unit per unit time follows a Poisson distribution.

Here, if the average number of passing particles per unit time is represented by λ, the average number of passing particles per time t is represented by λt. In addition, a probability that x target particles pass per time t is expressed by the following Mathematical Formula 2.

$$P(x \mid t) = e^{-(\lambda t)} \frac{(\lambda t)^x}{x!}$$ [Mathematical Formula 2]

Furthermore, a probability that a target particle does not pass during time t can be expressed by the following Mathematical Formula 3 on the basis of Mathematical Formula 2.

$$P(0 \mid t) = e^{-(\lambda t)} \frac{(\lambda t)^0}{0!} = e^{-\lambda t}$$ [Mathematical Formula 3]

In addition, paying attention to a certain target particle, a probability that no particle is present in forward time $T_0$ of the target particle and that no particle is present in backward time thereof $T_1$ can be expressed by the following Mathematical Formula 4 on the basis of Mathematical Formula 2.

$$P(0 \mid T_0) \cdot P(0 \mid T_1) = e^{-\lambda T_0} \cdot e^{-\lambda T_1} = e^{-\lambda(T_0 + T_1)}$$ [Mathematical Formula 4]

Furthermore, when a flow cytometer extracts a target particle, it is considered that the target particle (the number of passing target particles per unit time is represented by $\lambda_T$) and a non-target particle (the number of passing non-target particles per unit time is represented by $\lambda_U$) are mixed. In addition, in a case where a certain target particle is captured, considering a group of $A\lambda_U+1$ particles including the target particle and non-target particles present before and behind the target particle, the particles included in this group do not correlate with one another. Therefore, a probability that a non-target particle does not pass in forward time $T_0$ of the target particle and that no non-target particle does not pass in backward time thereof $T_1$ can be expressed by the following Mathematical Formula 5.

$$e^{-(\lambda_U + 1)(T_0 + T_1)} \approx e^{-\lambda_U(T_0 + T_1)}$$ [Mathematical Formula 5]

Provided that $T_0 + T_1 \ll 1$ is satisfied.

Next, extraction efficiency E for a detected target particle will be described below with reference to FIG. 4.

Here, a time width (hereinafter referred to as "capture time width") of incoming particle group taken in by one extraction operation is represented by $T_p$.

Figure 4:
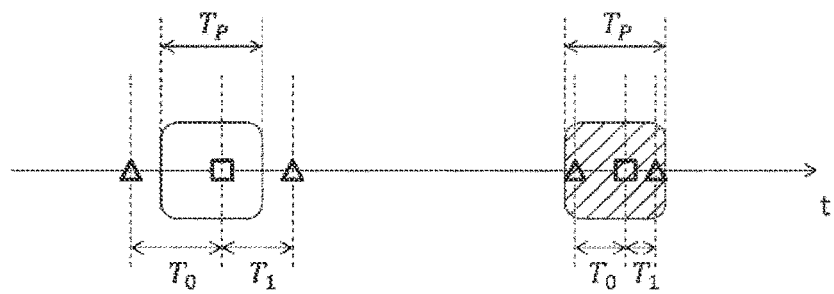
FIG. 4 is a schematic conceptual diagram schematically illustrating a positional relationship between a target particle and a non-target particle when a target particle is captured in the first extraction unit.
Figure 4:
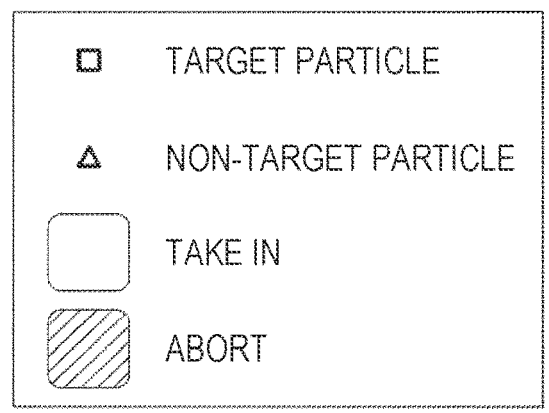

Then, in general, in order to secure a target particle ratio P in an extraction sample, a flow cytometer takes in the target particle in a case of $T_0 + T_1 > T_p$ in FIG. 4. Meanwhile, in a case of $T_0 + T_1 \leq T_p$, determination that the target particle is not taken in (abort processing) is performed.

For this reason, the extraction efficiency E for a detected target particle can be expressed by the following Mathematical Formula 6.

$$E = e^{-\lambda_U T_P}$$ [Mathematical Formula 6]

Figure 5:
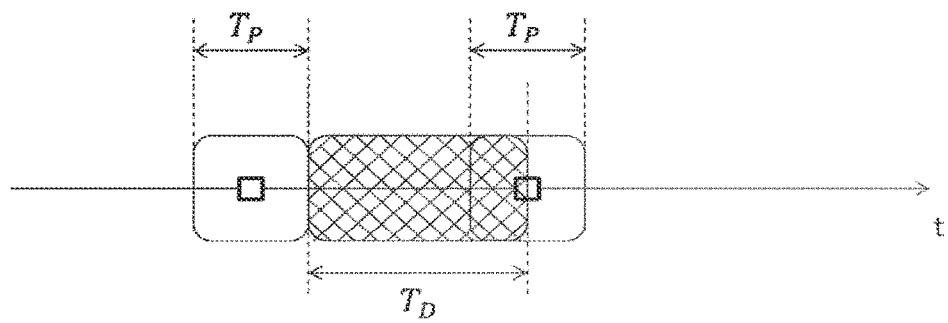
FIG. 5 is a schematic conceptual diagram schematically illustrating a time period during which a subsequent particle cannot be taken in immediately after extraction in the first extraction unit.
Figure 5:
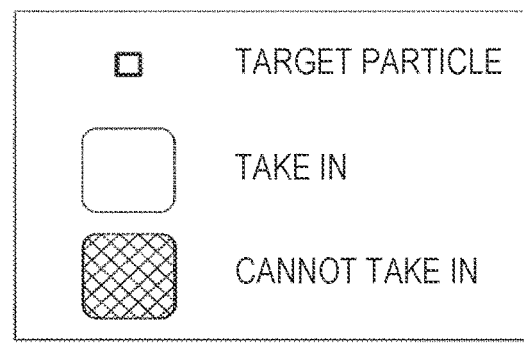
Figure 6:
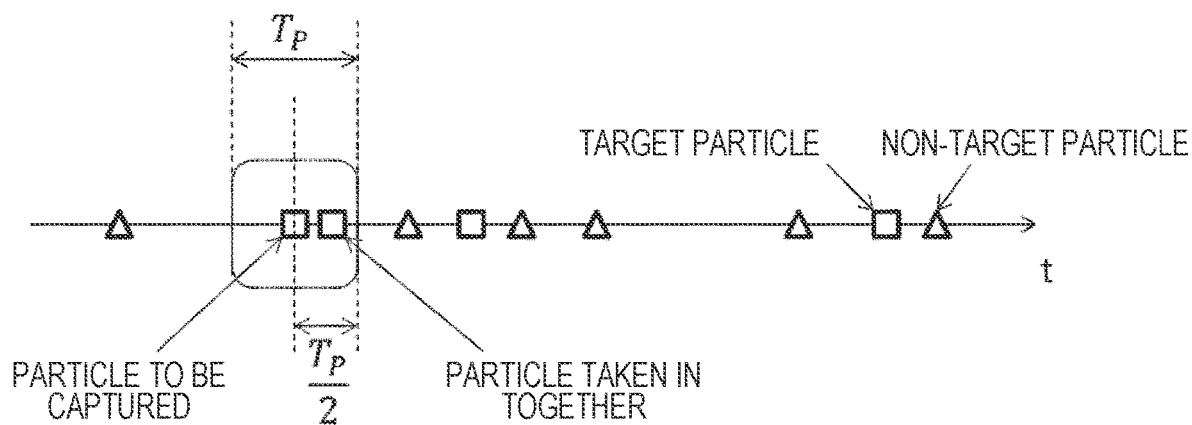
FIG. 6 is a schematic conceptual diagram for explaining, when the first extraction unit captures a target particle, a probability that the first extraction unit takes in a target particle present near the target particle to be captured.

In addition, when a flow cytometer performs extraction, particularly in a case where a micro flow path method is adopted, as illustrated in FIG. 5, a time period (hereinafter referred to as "dead time $T_D$") in which a subsequent particle cannot be taken in immediately after extraction) is present. Therefore, in a case where the detection number λ of a whole sample per unit time in the first extraction unit 11 of the particle extraction apparatus 1 according to the present technology is indicated in relation to a final target particle recovery ratio Y on the basis of Mathematical Formula 1, it is also necessary to consider the dead time $T_D$.

Furthermore, in a case where a flow cytometer does not perform abort processing, when capturing a target particle that has reached an extraction unit, the flow cytometer may also take in a target particle present near the target particle to be captured.

In such a case, all the particles present in the past on the time axis as compared with a particle to be captured should have already been captured. Therefore, as illustrated in FIG. 6, it can be recognized that a particle which may be captured together is only a particle present in a future time width $T_p/2$ as compared with the particle to be captured.

Therefore, considering a probability that a group of remaining $\lambda_r - 1$ target particles is mixed with respect to one target particle to be captured in a time width of $T_p/2$, an average value of the number of target particles captured by one extraction operation can be expressed by the following Mathematical Formula 7.

$$R \cdot (1+(\lambda_T-1)T_P/2) \approx R \cdot (1+\lambda_T T_P/2) \quad \text{[Mathematical Formula 7]}$$

Provided that $T_P \ll 1$ is satisfied.

In addition, in a case where the flow cytometer performs abort processing, it is necessary to consider an expected value $T_c$ of time required for actually capturing a certain target particle after trying to capture the target particle.

Here, an average arrival time interval of a target particle is $1/\lambda_T$. Therefore, if $e^{-\lambda_U T_P} \equiv E$ is defined, the expected value $T_c$ can be expressed by the following Mathematical Formula 8. Here, the first term of Mathematical Formula 8 represents time in a case where the first particle is not aborted but taken in, the second term represents time in a case where the first particle is aborted and the second particle is taken in, the third term represents time in a case where the first and second particles are aborted and the third particle is taken in, the fourth term represents time in a case where the first, second, and third particles are aborted and the fourth particle is taken in, and the like.

[Mathematical Formula 8]

$$T_C = 0 \cdot E + \frac{1}{\lambda_T} \cdot E \cdot (1-E) + \frac{2}{\lambda_T} \cdot E \cdot (1-E) \cdot (1-E) + \frac{3}{\lambda_T} \cdot E \cdot (1-E) \cdot (1-E) \cdot (1-E) + \ldots$$

On the basis of Mathematical Formula 8, the following Mathematical Formula 9 is calculated.

[Mathematical Formula 9]

$$\begin{aligned}
T_C &= 0 \cdot E + \frac{1}{\lambda_T} \cdot E \cdot (1-E) + \frac{2}{\lambda_T} \cdot E \cdot (1-E) \cdot (1-E) + \\
&\quad \frac{3}{\lambda_T} \cdot E \cdot (1-E) \cdot (1-E) \cdot (1-E) + \ldots \\
&= \frac{1}{\lambda_T} \cdot E \cdot (1-E)[1 + 2(1-E) + 3(1-E)^2 + \ldots] \\
&= \frac{1}{\lambda_T} \cdot E \cdot (1-E) \frac{1}{(1-(1-E))^2} \\
&= \frac{1}{\lambda_T} \cdot \frac{1-E}{E} \\
&= \frac{1}{\lambda_T} \cdot \frac{1-e^{-\lambda_U T_P}}{e^{-\lambda_U T_P}}
\end{aligned}$$

Incidentally, a relational formula expressed by the following Mathematical Formula 10 was used for the calculation of Mathematical Formula 9.

[Mathematical Formula 10]

$$(1-x)(1+2x+3x^2+\ldots) = 1 + x + x^2 + \ldots = \frac{1}{1-x}$$

$$\therefore 1 + 2x + 3x^2 + \ldots = \frac{1}{(1-x)^2}$$

Furthermore, as described above, in a case where the flow cytometer performs extraction, a target particle and a non-target particle may be mixed.

Here, for example, in a case where the number of passing target particles per unit time when the target particles pass through the first extraction unit 11 is represented by $\lambda_T$, and the number of passing non-target particles per unit time when the non-target particles pass through the first extraction unit 11 is represented by $\lambda_U$, a whole sample input to a particle extraction apparatus can be expressed by the following Mathematical Formula 11.

$$\lambda = \lambda_T + \lambda_U \quad \text{[Mathematical Formula 11]}$$

Furthermore, according to Mathematical Formula 11, a ratio r of the number of target particles with respect to the total number of particles can be expressed by the following Mathematical Formula 12.

$$r \equiv \frac{\lambda_T}{\lambda_T + \lambda_U} = \frac{\lambda_T}{\lambda} \quad \text{[Mathematical Formula 12]}$$

From the above, the number $\lambda r$ of passing target particles per unit time when the target particles pass through the first extraction unit 11 and the number $\lambda_U$ of passing non-target particles per unit time when the non-target particles pass through the first extraction unit 11 can be expressed by the following Mathematical Formula 13.

$$\lambda_T = r\lambda$$

$$\lambda_U = (1-r)\lambda \quad \text{[Mathematical Formula 13]}$$

By using the parameters expressed by Mathematical Formulas 2 to 13, it is possible to calculate a recovery ratio Y1 with respect to a whole sample to be extracted in the first extraction unit 11 according to the present technology.

Here, if the extraction number per unit time is represented by N, time spent for aborting is $N \cdot T_C$, and time spent for dead time is $N \cdot T_D$. Therefore, effective time contributing to extraction per unit time is represented by $1 - N \cdot T_D - N \cdot T_C$. Therefore, an average value of the number of target particles captured per unit time satisfies an equation expressed by the following Mathematical Formula 14.

$$N \cdot R \cdot (1+\lambda_T T_P/2) = R \cdot \lambda_T (1 - N \cdot T_D - N \cdot T_C) \quad \text{[Mathematical Formula 14]}$$

By converting Mathematical Formula 14, N can be expressed by the following Mathematical Formula 15.

$$N = \frac{\lambda_T}{1 + \lambda_T(T_P/2 + T_D + T_C)} \quad \text{[Mathematical Formula 15]}$$

According to Mathematical Formula 15, the average value of the number of target particles captured per unit time can be expressed by the following Mathematical Formula 16.

[Mathematical Formula 16]

$$N \cdot R \cdot (1 + \lambda_T T_P/2) = R \cdot \lambda_T \cdot \frac{1 + \lambda_T T_P/2}{1 + \lambda_T(T_P/2 + T_D + T_C)}$$

In addition, the first extraction unit 11 in the present technology does not perform abort processing. Therefore, the value of $T_C$ in the mathematical formula is 0, and Mathematical Formula 16 is converted into the following Mathematical Formula 17. This value is the number $\lambda_{T2}$ of target particles input to the second extraction unit 12 per unit time.

[Mathematical Formula 17]

$$N \cdot R \cdot (1 + \lambda_T T_P/2) = R \cdot \lambda_T \cdot \frac{1 + \lambda_T T_P/2}{1 + \lambda_T(T_P/2 + T_D + T_C)}$$
$$= R \cdot \lambda_T \cdot \frac{1 + \lambda_T T_P/2}{1 + \lambda_T(T_P/2 + T_D)}$$
$$\equiv \lambda_{T2}$$

Similarly, the average value of the number of non-target particles captured per unit time can be expressed by the following Mathematical Formula 18. This value is the number $\lambda_{U2}$ of target particles input to the second extraction unit 12 per unit time.

[Mathematical Formula 18]

$$N \cdot R \cdot \lambda_U T_P = R \cdot \lambda_T \cdot \frac{\lambda_U T_P}{1 + \lambda_T(T_P/2 + T_D + T_C)}$$
$$= R \cdot \lambda_T \cdot \frac{\lambda_U T_P}{1 + \lambda_T(T_P/2 + T_D)}$$
$$\equiv \lambda_{U2}$$

From the above results, the recovery ratio Y1 with respect to the whole sample to be extracted in the first extraction unit 11 is a value obtained by dividing "the number of extracted target particles (Mathematical Formula 17)" by "the number $\lambda_T$ of target particles in an input whole sample", and can be expressed by the following Mathematical Formula 19.

[Mathematical Formula 19]

$$Y_1 = \frac{R \cdot \lambda_T \cdot \frac{1 + \lambda_T T_P/2}{1 + \lambda_T(T_P/2 + T_D)}}{\lambda_T} = R \cdot \frac{1 + \lambda_T T_P/2}{1 + \lambda_T(T_P/2 + T_D)}$$

Next, a recovery ratio Y2 of a target particle with respect to an extraction sample to be extracted in the second extraction unit 12 is calculated.

First, an average value of the number of target particles captured per unit time satisfies an equation expressed by the following Mathematical Formula 20.

$$N \cdot R \cdot (1 + \lambda_{T2} T_P/2) = R \cdot \lambda_{T2} \cdot (1 - N \cdot T_D - N \cdot T_C) \quad \text{[Mathematical Formula 20]}$$

By converting Mathematical Formula 20, N can be expressed by the following Mathematical Formula 21.

[Mathematical Formula 21]

$$N = \frac{\lambda_{T2}}{1 + \lambda_{T2}(T_P/2 + T_D + T_C)}$$

According to Mathematical Formula 21, the average value of the number of target particles captured per unit time can be expressed by the following Mathematical Formula 22.

[Mathematical Formula 22]

$$N \cdot R \cdot (1 + \lambda_{T2} T_{P2}/2) = R \cdot \lambda_{T2} \cdot \frac{1 + \lambda_{T2} T_P/2}{1 + \lambda_{T2}(T_P/2 + T_D + T_C)}$$

The recovery ratio Y2 in the second extraction unit 12 is a value obtained by dividing "the number of extracted target particles (Mathematical Formula 22)" by "the number $\lambda_{T2}$ of target particles in an input whole sample".

Therefore, the recovery ratio Y2 can be expressed by the following Mathematical Formula 23.

[Mathematical Formula 23]

$$Y_2 = \frac{R \cdot \lambda_{T2} \cdot \frac{1 + \lambda_{T2} T_P/2}{1 + \lambda_{T2}(T_P/2 + T_D + T_C)}}{\lambda_{T2}} = R \cdot \frac{1 + \lambda_{T2} T_P/2}{1 + \lambda_{T2}(T_P/2 + T_D + T_C)} =$$
$$R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}}$$

Provided that $$T_C = \frac{1}{\lambda_T} \cdot \frac{1 - e^{-\lambda_U T_P}}{e^{-\lambda_U T_P}}$$

was used.

In the particle extraction apparatus 1 according to the present technology, extraction by the first extraction unit 11 and extraction by the second extraction unit 12 are performed. Therefore, a recovery ratio $Y_{Cascode}$ of a target particle by extraction of the particle extraction apparatus 1 is a value obtained by multiplying the recovery ratio Y1 in the first extraction unit 11 by the recovery ratio Y2 in the second extraction unit 12 as illustrated in the following Mathematical Formula 24.

[Mathematical Formula 24]

$$Y_{Cascode} = Y_1 Y_2 = R \cdot \frac{1 + \lambda_T T_P/2}{1 + \lambda_T(T_P/2 + T_D)} \cdot$$
$$R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}}$$

According to Mathematical Formula 24, in the particle extraction apparatus 1 according to the present technology, the recovery ratio $Y_{Cascode}$ is preferably equal to or higher than the final desired recovery ratio Ys of a target particle.

The particle extraction apparatus 1 according to the present technology configured as described above includes the first extraction unit 11 and the second extraction unit 12, includes a plurality of components for performing extraction, and therefore can extract a target particle at high speed with high purity.

In addition, the particle extraction apparatus 1 can perform an extraction operation superimposed by the first extraction unit 11 and the second extraction unit 12, and is not configured so as to simply dispose a plurality of extraction mechanisms. Therefore, an increase in size of the particle extraction apparatus and an increase in cost can be avoided as much as possible.

Furthermore, by setting the detection number $\lambda$ of a whole sample per unit time in the first extraction unit 11 such that the recovery ratio $Y_{Cascode}$ is equal to or higher than the final desired recovery ratio Ys of a target particle, the particle extraction apparatus 1 according to the present technology can extract the target particle with higher purity.

<2. Particle Extraction Apparatus According to Second Embodiment>

Next, a second embodiment of the particle extraction apparatus according to the present technology will be described with reference to FIG. 7.

In the particle extraction apparatus 1 according to the present technology, illustrated in FIG. 1 or the like, the first extraction unit 11 and the second extraction unit 12 are configured as separate members. However, in a particle extraction apparatus 2 according the second embodiment, the first extraction unit 11 and the second extraction unit 12 are formed as the same member, and a single extraction unit 21 has the functions of the first extraction unit 11 and the second extraction unit 12 according to the first embodiment. Along with this, the particle extraction apparatus 2 includes a first valve 22, a second valve 23, and an extraction sample housing unit 24 for circulating a target particle.

Hereinafter, a configuration different from the particle extraction apparatus 1 according to the first embodiment, that is, the configurations of the first valve 22, the second valve 23, and the extraction sample housing unit 24 will be mainly described, and a component common to the particle extraction apparatus 1 according to the first embodiment will be denoted by the same reference numeral, and description thereof will be omitted.

Incidentally, since the configuration of the single extraction unit of the present embodiment is the same as that of each of the first extraction unit 11 and the second extraction unit 12 of the particle extraction apparatus 1 according to the first embodiment, description thereof will also be omitted.

(1) First Valve

The particle extraction apparatus 2 according to the second embodiment includes the first valve 22 on a flow path through which a whole sample containing a target particle flows. This first valve 22 is disposed in a connection region between a flow path L for sending the whole sample to the extraction unit 21 and a flow path M through which a particle extracted by the extraction unit 21 flows, and includes on-off valves 22a and 22b disposed on the flow path L and an on-off valve 22c disposed on the flow path M.

(2) Second Valve

The particle extraction apparatus 2 includes the second valve 23 on a flow path through which a particle extracted by the extraction unit 21 flows. The second valve 23 is disposed in a connection region among a flow path N through which a particle extracted by the extraction unit 21 flows, a flow path O connected to the storage unit 15, and the flow path M, and includes an on-off valve 23a disposed on the flow path M, an on-off valve 23b disposed on the flow path N, and an on-off valve 23c disposed on the flow path O.

(3) Extraction Sample Housing Unit

The particle extraction apparatus 2 according to the second embodiment includes the extraction sample housing unit 24 connected to the flow path M. This extraction sample housing unit 24 is connected to the flow path M, and therefore houses the extraction sample extracted by the extraction unit 21.

In addition, in the particle extraction apparatus 2 according to the second embodiment, the extraction sample housing unit 24 stirs an extraction sample and returns a particle interval in the extraction sample to a random state. That is, in the particle extraction apparatus 2 according to the second embodiment, the extraction sample housing unit 24 also functions as the stirring unit 13 according to the first embodiment.

The configuration of this extraction sample housing unit 24 is not particularly limited, and can be appropriately changed depending on a storage environment condition of a target particle, a usage environment of a particle extraction apparatus, and the like, and a known structure can be adopted.

In such a particle extraction apparatus 2 according to the second embodiment, first, the on-off valves 22a and 22b of the first valve 22 are opened, and the on-off valve 22c is closed. In addition, the on-off valves 23a and 23b of the second valve 23 are opened, and the on-off valve 23c is closed.

By driving a liquid feeding unit 16 in such a state, a whole sample in a housing unit 14 is fed to the extraction unit 21.

Thereafter, the extraction unit 21 functions in the same manner as the first extraction unit 11 of the first embodiment, and extracts an extraction sample containing a target particle from the whole sample. Then, the extracted extraction sample flows through the flow paths N and M, and is finally housed in the extraction sample housing unit 24. Furthermore, the extraction sample is stirred in the extraction sample housing unit 24, and the particle interval in the extraction sample is returned to a random state.

Thereafter, the on-off valve 22a of the first valve 22 is closed, the on-off valves 22b and 22c are opened, the on-off valve 23a of the second valve 23 is closed, and the on-off valves 23b and 23c are opened.

By driving the liquid feeding unit 16 in such a state, the extraction sample in the extraction sample housing unit 24 flows through the flow path M and the flow path L and flows into the extraction unit 21 again.

In this case, the extraction unit 21 functions in the same manner as the second extraction unit 12 of the first embodiment and extracts a target particle from the extraction sample. Then, the extracted target particle flows through the flow path N and the flow path O and is stored in the storage unit 15.

That is, in the particle extraction apparatus 2 according to the second embodiment, the target particle circulates through the flow paths L, N, and M, and extraction is performed twice.

Even with such a particle extraction apparatus 2, a target particle can be extracted at high speed with high purity. In addition, the particle extraction apparatus 2 is not configured so as to simply dispose a plurality of extraction mechanisms. Therefore, an increase in size of the particle extraction apparatus and an increase in cost can be avoided as much as possible.

Furthermore, by setting a detection number λ of a whole sample per unit time in the extraction unit 21 in the first cycle such that a recovery ratio $Y_{Cascode}$ is equal to or higher than a final desired recovery ratio Ys of a target particle, the particle extraction apparatus 2 according to the present technology can extract the target particle with higher purity.

Figure 7:
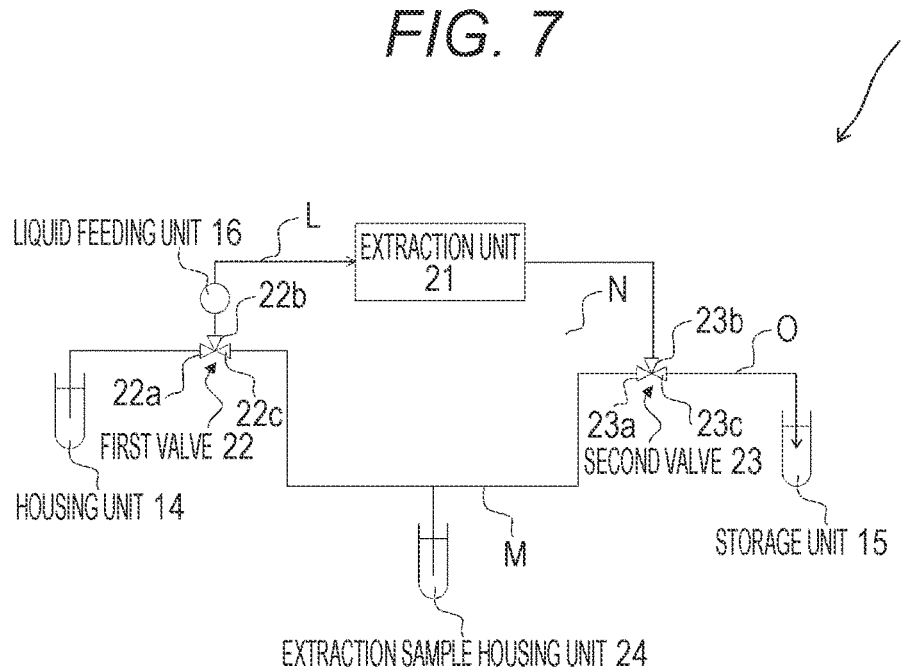
FIG. 7 is a schematic conceptual diagram schematically illustrating a concept of a second embodiment of the particle extraction apparatus according to the present technology.

Incidentally, the configurations of the first valve 22 and the second valve 23 illustrated in FIG. 7 are merely examples. Another configuration may be adopted as long as a target particle circulates through the flow paths L, N, and M and extraction is performed a plurality of times.

<3. Particle Extraction Apparatus According to Third Embodiment>

Next, a third embodiment of the particle extraction apparatus according to the present technology will be described with reference to FIG. 8.

Here, in a case where a ratio of a target particle in a whole sample is lower than a predetermined threshold value, as in the particle extraction apparatuses 1 and 2 according to the first and second embodiments, extraction is preferably performed in a cascade manner by the first extraction unit 11 and the second extraction unit 12 (hereinafter referred to as "cascade method"). Meanwhile, in a case where the ratio of a target particle in a whole sample is higher than the predetermined threshold value, extraction by the first extraction unit 11 and extraction by the second extraction unit 12 are suitably performed in parallel for performing extraction at high speed (hereinafter referred to as "parallel method").

Therefore, in the particle extraction apparatus 3 according to the third embodiment, it is possible to switch between the extraction method by a first extraction unit 11 and the extraction method by a second extraction unit 12 depending on a ratio of a target particle in a whole sample. Along with this, the particle extraction apparatus 3 includes a first valve 31, a second valve 32, a third valve 33, and a fourth valve 34.

Hereinafter, a configuration different from the particle extraction apparatus 1 according to the first embodiment will be mainly described, and a component common to the particle extraction apparatus 1 according to the first embodiment will be denoted by the same reference numeral, and description thereof will be omitted.

In the particle extraction apparatus 3 according to the third embodiment, a small amount of sample is caused to flow in a detection system 110 in advance, and the detection system 110 measures a ratio of a target particle in a whole sample.

Incidentally, in a case where a user can recognize a ratio of a target particle in a whole sample, the detection system 110 does not need to measure the ratio of a target particle in a whole sample in advance.

(1) First Valve

The particle extraction apparatus 3 according to the third embodiment includes the first valve 31. This first valve 31 is disposed on a flow path L connecting the housing unit 14 to a stirring unit 13. In addition, the first valve 31 opens and closes the flow path L depending on a ratio of a target particle in a whole sample.

The configuration of the first valve 31 is not particularly limited as long as being able to open and close the flow path L, and a known on-off valve or the like can be adopted.

(2) Second Valve

The particle extraction apparatus 3 according to the third embodiment includes the second valve 32. The second valve 32 is disposed on a flow path N branching from the flow path M connecting the second extraction unit 12 to a storage unit 15 and connected to the stirring unit 13. In addition, the second valve 32 opens and closes the flow path N depending on a ratio of a target particle in a whole sample.

The configuration of the second valve 32 is not particularly limited as long as being able to open and close the flow path N, and a known on-off valve or the like can be adopted.

(3) Third Valve

The particle extraction apparatus 3 according to the third embodiment includes the third valve 33. The third valve 33 is disposed in a connecting region between the flow path L and a flow path O branching from the flow path L and connected to the second extraction unit 12, and includes on-off valves 33a and 33c disposed on the flow path L and an on-off valve 33b disposed on the flow path O.

(4) Fourth Valve

The particle extraction apparatus 3 according to the third embodiment also includes the fourth valve 34. The fourth valve 34 is disposed in a connecting region between the flow path N and a flow path P branching from the flow path N and connected to the first extraction unit 11, and includes on-off valves 34a and 34c disposed on the flow path N and an on-off valve 34b disposed on the flow path P.

In such a particle extraction apparatus 3 according to the third embodiment, in a case where a ratio of a target particle in a whole sample is lower than a threshold value (target particle ratio at which a recovery ratio $Y_{Parallel}$ in the cascade method and the recovery ratio $Y_{Cascode}$ in the parallel method are equal to each other), the first valve 31 and the closing valve 33a of the third valve 33 are closed to close the flow path L. In addition, the second valve 32 and the closing valve 34a of the fourth valve 34 are closed to close the flow path N.

As a result, a whole sample containing a target particle is sent to the first extraction unit 11 by driving of the liquid feeding unit 16. Then, the first extraction unit 11 extracts only an extraction sample from the whole sample.

This extraction sample flows in order of the flow path P, the stirring unit 13, and the flow path O, and flows into the second extraction unit 12. Then, the second extraction unit 12 extracts only a target sample from the extraction sample, and the target particle flows through the flow path M and is stored in the storage unit 15.

In such a case, since the configuration is the same as that of the particle extraction apparatus 1 according to the first embodiment, the detection number λ of the whole sample per unit time in the first extraction unit 11 is preferably set within a range satisfying the following Mathematical Formula 25.

[Mathematical Formula 25]

$$Y_{Cascode} = R \cdot \frac{1 + \lambda_T T_P/2}{1 + \lambda_T (T_P/2 + T_D)} \cdot R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}} \geq Y_S$$

Meanwhile, in a case where the ratio of the target particle in the whole sample is higher than the threshold value, the first valve 31 is opened, the on-off valve 33c in the third valve 33 is closed, and the on-off valves 33a and 33b are opened. As a result, the flow path L and the flow path O communicate with each other.

In addition, the second valve 31 is opened, the on-off valve 34c in the fourth valve 34 is closed, and the on-off valves 34a and 34b are opened. As a result, the flow path P, the flow path N, and the flow path M communicate with one another.

By performing setting in this manner, the whole sample discharged from the housing unit 14 by driving of the liquid feeding unit 16 is supplied at the same time as extraction by the first extraction unit 11 and extraction by the second extraction unit 12. Finally, the target particle extracted by each of the extraction units 11 and 12 is stored in the storage unit 15.

Here, if the extraction number per unit time is represented by N, time spent for aborting is $N \cdot T_C$, and time spent for dead time is $N \cdot T_D$. Therefore, effective time contributing to extraction per unit time is represented by $1 - N \cdot T_D - N \cdot T_C$. Therefore, an average value of the number of target particles captured per unit time satisfies an equation expressed by the following Mathematical Formula 26.

$$N \cdot R \cdot (1 + \lambda_T T_P/2) = R \cdot \lambda_T \cdot (1 - N \cdot T_D - N \cdot T_C) \quad \text{[Mathematical Formula 26]}$$

By converting the Mathematical Formula 26, N can be expressed by the following Mathematical Formula 27.

$$N = \frac{\lambda_T}{1 + \lambda_T(T_P/2 + T_D + T_C)} \quad \text{[Mathematical Formula 27]}$$

According to the Mathematical Formula 27, the average value of the number of target particles captured per unit time can be expressed by the following Mathematical Formula 28.

$$N \cdot R \cdot (1 + \lambda_T T_P/2) = R \cdot \lambda_T \cdot \frac{1 + \lambda_T T_P/2}{1 + \lambda_T(T_P/2 + T_D + T_C)} \quad \text{[Mathematical Formula 28]}$$

Here, a recovery ratio in one extraction can be defined as a value obtained by dividing "the number of extracted target particles (Mathematical Formula 28)" by "the number $\lambda_T$ of target particles in an input whole sample". Therefore, the recovery ratio Y can be expressed by the following Mathematical Formula 29.

$$Y = \frac{R \cdot \lambda_{T2} \cdot \frac{1 + \lambda_{T2} T_P/2}{1 + \lambda_T(T_P/2 + T_D + T_C)}}{\lambda_T} = R \cdot \frac{1 + \lambda_T T_P/2}{1 + \lambda_T(T_P/2 + T_D + T_C)} = R \cdot \frac{1 + \lambda_T T_P/2}{1 + \lambda_T(T_P/2 + T_D) + (1 - e^{-\lambda_U T_P})/e^{-\lambda_U T_P}} \quad \text{[Mathematical Formula 29]}$$

In addition, in a parallel method, if the parallel number is represented by M, $\lambda_T$ and $\lambda_U$ in Mathematical Formula 29 can be replaced with $\lambda_T/M$ and $\lambda_U/M$, respectively. As a result, the recovery ratio $Y_{Parallel}$ in the case of the parallel method can be represented by the following Mathematical Formula 30.

$$Y = R \cdot \frac{M + \lambda_T T_P/2}{M + \lambda_T(T_P/2 + T_D) + M \cdot (1 - e^{-\lambda_U T_P/M})/e^{-\lambda_U T_P/M}} \quad \text{[Mathematical Formula 30]}$$

From the above, in the particle extraction apparatus 3 according to the third embodiment, in a case where the parallel method is adopted, the detection number λ of a whole sample per unit time in each of the extraction units 11 and 12 is preferably set such that the recovery ratio $Y_{Parallel}$ by the extraction units 11 and 12 is equal to or higher than the final desired recovery ratio Ys of a target particle as expressed by the following Mathematical Formula 31.

$$Y_{Parallel} = R \cdot \frac{M + \lambda_T T_P/2}{M + \lambda_T(T_P/2 + T_D) + M \cdot (1 - e^{-\lambda_U T_P/M})/e^{-\lambda_U T_P/M}} \geq Y_S \quad \text{[Mathematical Formula 31]}$$

A switching reference between the cascade method and the parallel method will be described more specifically. In a case where a maximum event rate satisfying the Mathematical Formula 30 is represented by "$\lambda_{Parallel\_max}$" and a maximum event rate satisfying the Mathematical Formula 25 is represented by "$\lambda_{Cascode\_max}$", in a case of the condition of the following Mathematical Formula 32, the parallel method is selected. Meanwhile, in a case of the condition of the following Mathematical Formula 33, the cascade method is selected.

$$\lambda_{Parallel\_max} \geq \lambda_{Cascode\_max} \quad \text{[Mathematical Formula 32]}$$

$$\lambda_{Parallel\_max} < \lambda_{Cascode\_max} \quad \text{[Mathematical Formula 33]}$$

Such a particle extraction apparatus 3 according to the third embodiment switches between the cascade method and the parallel method by opening and closing the first valve 31, the second valve 32, the third valve 33, and the fourth valve 34.

That is, the first valve 31, the second valve 32, the third valve 33, and the fourth valve 34 correspond to an extraction switching unit according to the present technology.

The particle extraction apparatus 3 according to the third embodiment as described above can switch between the parallel method and the cascade method, and therefore can extract a target particle with high purity at high speed depending on a ratio of a target particle in a whole sample.

Furthermore, in a case where the cascade method is selected, the particle extraction apparatus 3 can extract a target particle at high speed with high purity. In addition, the particle extraction apparatus 3 is not configured so as to simply dispose a plurality of extraction mechanisms. Therefore, an increase in size of the particle extraction apparatus and an increase in cost can be avoided as much as possible. In addition, by setting the detection number λ of a whole sample per unit time in the first extraction unit 11 such that the recovery ratio $Y_{Cascode}$ is equal to or higher than the final desired recovery ratio Ys of a target particle, the particle extraction apparatus 3 according to the present technology can extract the target particle with higher purity.

Meanwhile, even in a case where the parallel method is selected, the particle extraction apparatus 3 can extract a target particle at high speed with high purity. In addition, the particle extraction apparatus 3 is not configured so as to simply dispose a plurality of extraction mechanisms. Therefore, an increase in size of the particle extraction apparatus and an increase in cost can be avoided as much as possible.

<4. Particle Extraction Microchip According to First Embodiment>

The present technology also provides a particle extraction microchip.

A particle extraction microchip according a first embodiment of the present technology will be described with reference to FIGS. 9 to 13.

A particle extraction microchip 4 (hereinafter also referred to as "microchip") according to the present technology includes a first extraction section A for extracting an extraction sample containing a target particle from a whole sample, a liquid feeding section 4B for feeding the extraction sample extracted in the first extraction section 4A, and a second extraction section 4C for extracting only a target particle from the extraction sample. The configuration of each of the sections will be described below.

(1) First Extraction Section

The microchip 4 includes a sample inlet 41 for introducing a whole sample containing a target particle. This sample inlet 41 is connected to a sample flow path 42 through which the whole sample flows. In addition, this microchip 4 includes a sheath liquid inlet 43 for introducing a sheath liquid. This sheath liquid inlet 43 branches into two sheath liquid flow paths 44 and 44, and the sheath liquid flows through these sheath liquid flow paths 44 and 44. Furthermore, these sheath liquid flow paths 44 and 44 join the sample flow path 42 to form one main flow path 45. In this main flow path 45, a laminar flow of a whole sample fed through the sample flow path 42 joins sheath liquid laminar flows fed through the sheath liquid flow paths 44 and 44 to form a sheath flow in which the laminar flow of the whole sample is sandwiched between the sheath liquid laminar flows.

In addition, in the main flow path 45, an irradiation unit 7A irradiates a whole sample flowing in the main flow path 45, particularly a target particle with excitation light. Fluorescence and/or scattered light emitted from the whole sample by this irradiation with light is detected by a light detection unit 8A. An optical signal detected by this light detection unit 8A is converted into an electric signal and output to a driving unit 9A. This driving unit 9A adjusts pressure in a pressure chamber 47 described later and exhibits a function of sending an extraction sample containing a target particle to the pressure chamber 47. Processing performed by the driving unit 9A will be described later.

Furthermore, the main flow path 45 branches into three flow paths on a downstream side. Specifically, the main flow path 45 branches into an extraction flow path 46 and two discarding flow paths 48 and 48. Among these flow paths, the extraction flow path 46 is a flow path for taking in an extraction sample which contains a target particle and which has been determined to satisfy predetermined optical characteristics by the driving unit 9A. In addition, the pressure chamber 47 for taking in an extraction sample containing a target particle is disposed on a downstream side of the extraction flow path 46. An inner space of this pressure chamber 47 is expanded in a planar direction (width direction of the extraction flow path 46) and also expanded in a cross-sectional direction (height direction of the extraction flow path 46). That is, the pressure chamber 47 is formed such that a cross section perpendicular to a flow direction of a whole sample and a sheath liquid is large.

Meanwhile, a whole sample not containing a target particle, which has been determined not to satisfy the predetermined optical characteristics by the driving unit 9A, is not taken in the extraction flow path 46, and flows through either one of the two discarding flow paths 48 and 48. Thereafter, the whole sample not containing the target particle is discharged to the outside through a discarding port 49.

That is, in a microchip 101, the irradiation unit 7A, the light detection unit 8A, the driving unit 9A, the extraction flow path 46, and the pressure chamber 47 correspond to the first extraction unit of the present technology, and exhibits the same function as the first extraction unit 11 of the particle extraction apparatus 1 illustrated in FIG. 1.

A target particle is taken in the extraction flow path 46 by generating a negative pressure in the extraction flow path 46 by the driving unit 9A and sucking the target particle into the extraction flow path 46 using this negative pressure. As a configuration for generating a negative pressure, an actuator for increasing and decreasing the volume of the pressure chamber 47 is considered. For example, a piezoelectric element such as a piezo element is considered.

The actuator generates a stretching force along with a change in applied voltage and changes a pressure in the pressure chamber 47. When flowing occurs in the extraction flow path 46 along with this change, the volume in the extraction flow path 46 changes at the same time. The volume in the extraction flow path 46 changes until reaching a volume defined by a displacement amount of the actuator corresponding to an applied voltage.

Figure 10:
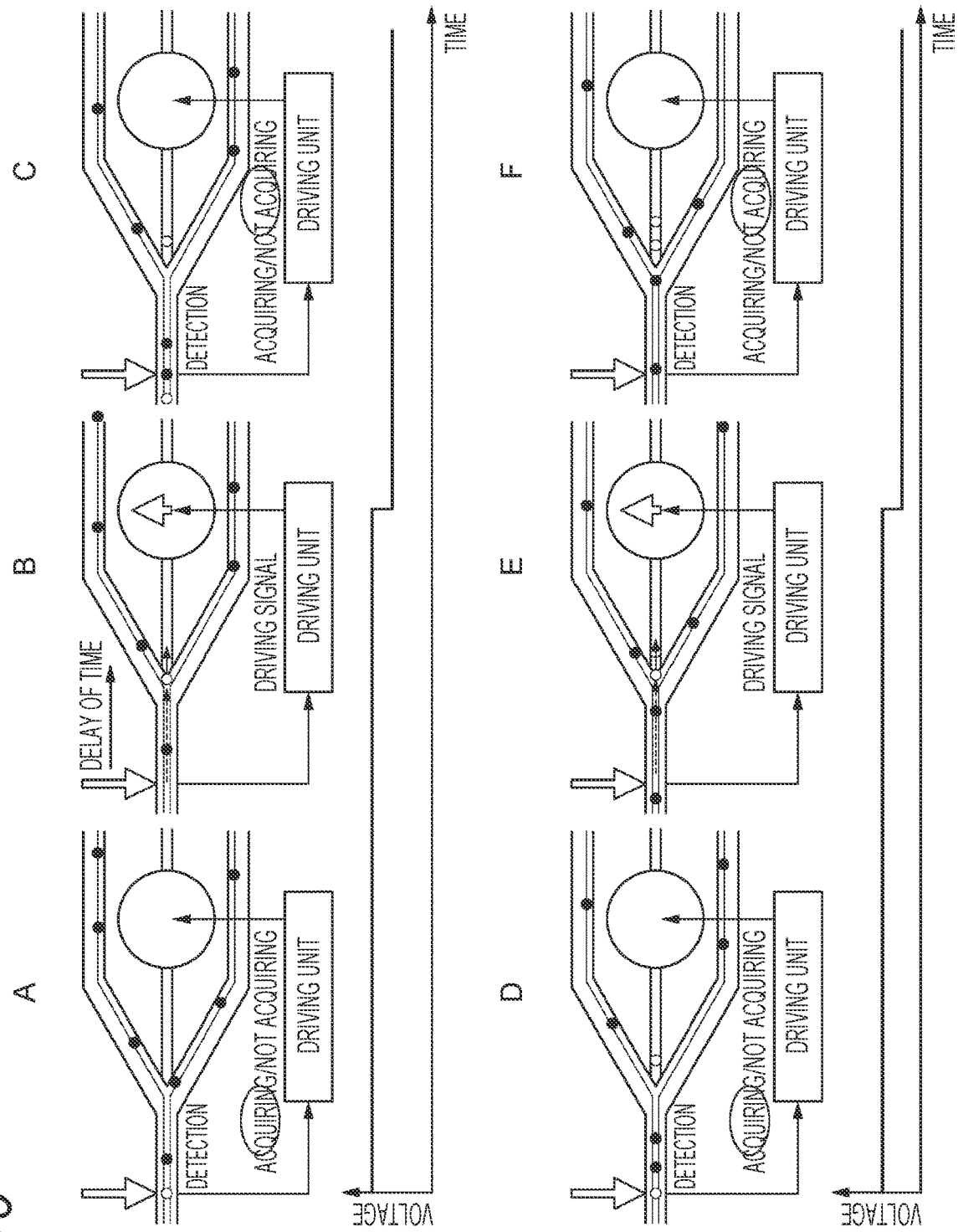
FIG. 10 is a diagram for explaining the extraction operation illustrated in FIG. 9.
Figure 11:
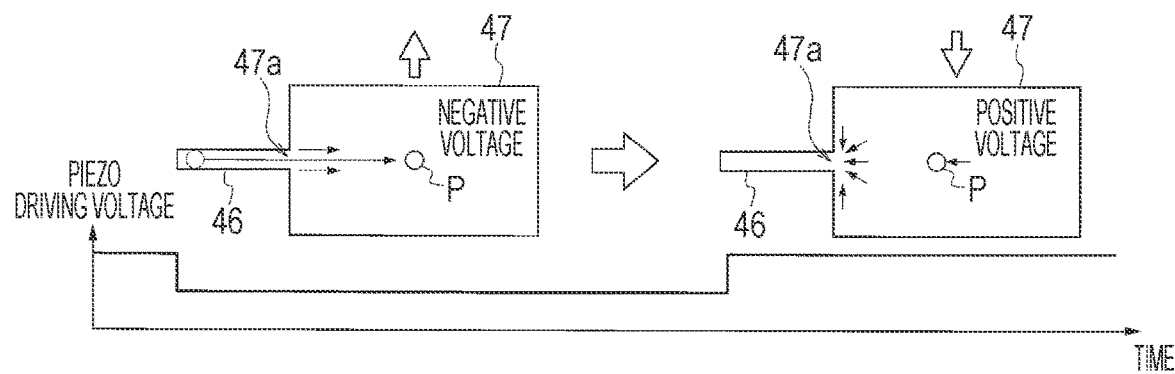
FIG. 11 is a diagram illustrating a function of a pressure chamber included in the microchip illustrated in FIG. 9.

Hereinafter, with reference to FIGS. 10 and 11, extraction will be described in detail with the driving unit 9A.

The driving unit 9A determines optical characteristics of a whole sample, particularly a target particle on the basis of an input electric signal. In a case where a particle is determined to be a target particle, as illustrated in FIGS. 10A and 10B, after time (delay time) required for an extraction sample containing the target particle to move from the main flow path 45 to a branching portion elapses, the driving unit 9A outputs a drive signal for acquiring the extraction sample to the actuator.

Specifically, in a case where the actuator is a piezo element, by applying a voltage that causes piezo contraction, increasing the volume of the pressure chamber 47, and setting the internal pressure of the extraction flow path 46 to a negative pressure, the driving unit 9A takes the extraction sample in the extraction flow path 46 from the inside of the main flow path 45.

Meanwhile, in a case where a microparticle is determined to be a non-target particle, the driving unit 9A outputs a drive signal for not acquiring the non-target particle to the actuator as illustrated in FIGS. 10C and 10D. In such a case, the actuator does not operate, and the non-target particle flows through either one of the two discarding flow paths 48 and 48.

The driving unit 9A repeats determination of optical characteristics of the target particle and output of a drive signal to the actuator until analysis is completed (see FIGS. 10E and 10F), and accumulates only an extraction sample containing the target particle in the extraction flow path 46 (see FIG. 10F).

The target particle which has been taken in the extraction flow path 46 is taken in the pressure chamber 47 as illustrated in FIG. 11A. In the figure, the reference numeral P indicates an extraction sample which has been taken in the pressure chamber 47, and the reference numeral 47a indicates an intake port of the extraction sample P to the pressure chamber 47. A flow of the extraction sample P becomes a jet when flowing into the pressure chamber 47 in which the inner space is expanded, and is separated from a flow path wall surface (see the arrow in FIG. 11A). For this reason, the extraction sample P leaves the intake port 47a and taken in the pressure chamber 47 to the back thereof.

As described above, the first extraction section 4A exhibits the same function as the first extraction unit 11 illustrated in FIG. 1. Therefore, a detection number $\lambda$ of a whole sample per unit time in the first extraction section 4A is preferably set within a range satisfying the following Mathematical Formula 34.

[Mathematical Formula 34]

$$Y_{Cascode} = R \cdot \frac{1 + \lambda_T T_P/2}{1 + \lambda_T (T_P/2 + T_D)} \cdot R \cdot$$

$$\frac{1 + \lambda_{T2} T_P/2}{1 + \lambda_{T2}(T_P/2 + T_D) + (1 - e^{-\lambda_{U2} T_P})/e^{-\lambda_{U2} T_P}} \geq Y_S$$

(2) Liquid Feeding Section

Next, the liquid feeding section 4B will be described. This liquid feeding section 4B includes an extraction sample flow path 51 connected to the pressure chamber 47 disposed in the first extraction section 4A, a stirring unit 52 for stirring an extraction sample, a discharge flow path 53 through which the extraction sample that has flowed through the stirring unit 52 flows, and two dampers 54 and 54 disposed on the extraction sample flow path 51 and the discharge flow path 53.

In this liquid feeding section 4B, a function of feeding the extraction sample flowing out from the first extraction section 4A is exhibited, and furthermore, in the stirring unit 52, a particle interval of the extraction sample is in a random state again as in the case of the whole sample.

The extraction sample flow path 51 is connected to the pressure chamber 47, and the extraction sample extracted in the first extraction section 4A is fed. Then, the extraction sample that has flowed through the extraction flow path 51 is fed into the stirring unit 52.

Next, the stirring unit 52 for stirring the extraction sample will be described with reference to FIGS. 12 and 13.

The stirring unit 52 adopts the configuration a so-called peristaltic dosing pump, and includes a stirring flow path 55 connected to the extraction sample flow path 51 and the discharge flow path 53, and a rotary disc 56 for performing compression and relaxation of the stirring flow path 55. The stirring flow path 55 is curved into a substantially U shape in a plan view in a circumferential direction around a rotation axis S of the rotary disc 56.

Meanwhile, the rotary disc 56 can be rotationally driven in a direction of the arrow X around the rotation axis S. This rotary disc 56 includes three rollers 57 disposed in a radial direction with respect to the rotation axis S. The three rollers 57, 57, and 57 are disposed at equal intervals in a circumferential direction with respect to the rotation axis S.

In addition, when the rotary disc 56 rotates around the rotation axis S, each of the rollers 57, 57, and 57 rotate around a roller rotation axis T. At this time, trajectories of each of the rollers 57, 57, and 57 are formed along the stirring flow path 55.

By rotation of the rotary disc 56 configured in this manner, compression and relaxation of the stirring flow path 55 are repeated. As a result, the extraction sample having a particle interval adjusted due to the first extraction section 4A is in a random state again in the stirring flow path 55 as in the case of the whole sample.

Then, the stirred extraction sample flows through the discharge flow path 53 and is fed to the second extraction section 4C.

Figure 12:
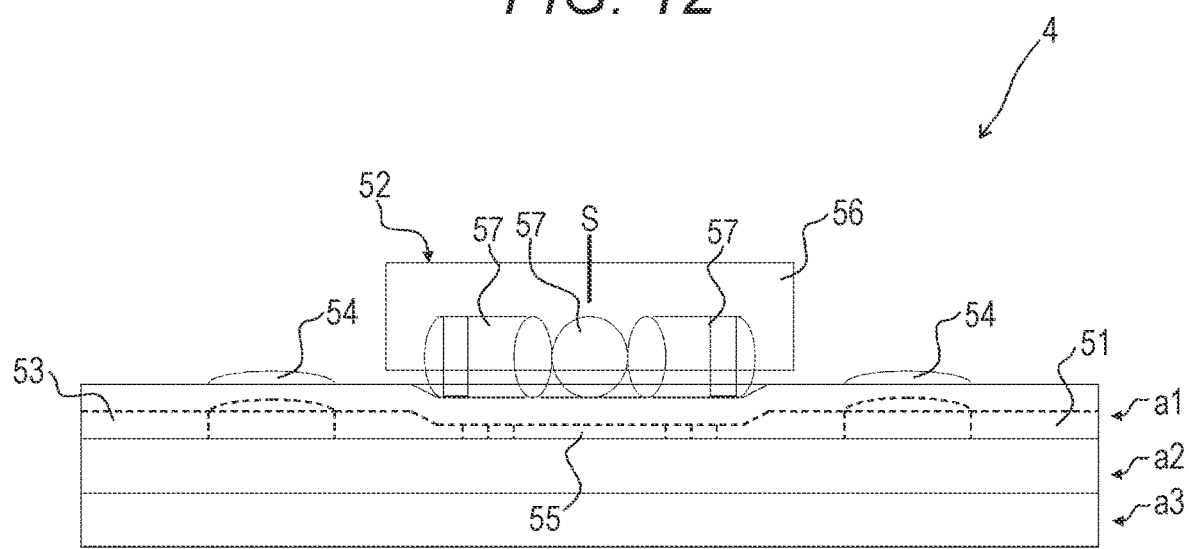
FIG. 12 is a side view of a stirring unit of the microchip illustrated in FIG. 9.
Figure 13:
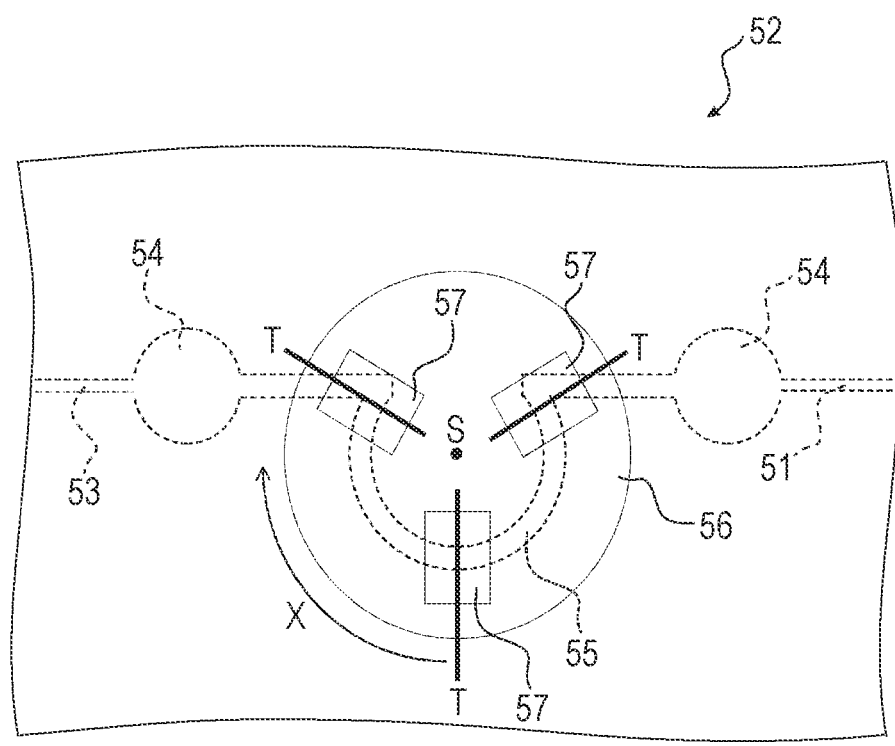
FIG. 13 is an enlarged view illustrating details of the stirring unit included in the microchip illustrated in FIG. 9.

Note that the stirring unit 52 illustrated in FIG. 12 or the like adopts the configuration of a peristaltic dosing pump. However, the configuration of the stirring unit 52 is not particularly limited, and a known configuration may be used as long as the particle interval in the extraction sample can be in a random state again.

As described above, in the liquid feeding section 4B, the stirring unit 52 adopts the configuration of a so-called peristaltic dosing pump, and compresses and relaxes the stirring flow path 55. For this reason, a pulsating flow is generated in the stirring flow path 55. Therefore, the particle extraction microchip according to the present technology is configured such that the pair of dampers 54 absorbs the pulsating flow generated in the stirring flow path 55.

(3) Second Extraction Section

The extraction sample stirred by the stirring unit 52 flows through the discharge flow path 53 and is fed to the second extraction section 4C.

This second extraction section 4C includes a sample inlet 61 for introducing the extraction sample that has flowed through the discharge flow path 53. This sample inlet 61 is connected to an extraction sample flow path 62 through which the extraction sample flows. In addition, the second extraction section 4C includes a sheath liquid inlet 63 for introducing a sheath liquid. This sheath liquid inlet 63 branches into two sheath liquid flow paths 64 and 64, and the sheath liquid flows through these sheath liquid flow paths 64 and 64. Furthermore, these sheath liquid flow paths 64 and 64 join the sample flow path 62 to form one main flow path 65. In this main flow path 65, a laminar flow of an extraction sample fed through the sample flow path 62 joins sheath liquid laminar flows fed through the sheath liquid flow paths 64 and 64 to form a sheath flow in which the laminar flow of the extraction sample is sandwiched between the sheath liquid laminar flows.

Furthermore, in the main flow path 65, an irradiation unit 7B irradiates an extraction sample flowing in the main flow path 65, particularly a target particle with excitation light. Fluorescence and/or scattered light emitted from the extraction sample by this irradiation with light is detected by a light detection unit 8B. An optical signal detected by this light detection unit 8B is converted into an electric signal and output to a driving unit 9B. This driving unit 9B adjusts pressure in a pressure chamber 67 connected to the main flow path 65 and exhibits a function of sending only a target particle to the pressure chamber 67.

Furthermore, the main flow path 65 branches into three flow paths on a downstream side. Specifically, the main flow path 65 branches into an extraction flow path 66 and two discarding flow paths 68 and 68. Among these flow paths, the extraction flow path 66 is a flow path for taking in a target particle which has been determined to satisfy predetermined optical characteristics by the driving unit 9B. In addition, the pressure chamber 67 for taking in only a target particle is disposed on a downstream side of the extraction flow path 66.

This pressure chamber 67 is connected to a storage flow path 69, and a target particles in the pressure chamber 67 flows through the storage flow path 69 and is fed to a storage unit (not illustrated) in which the target particle is stored.

Meanwhile, a non-target particle which has been determined not to satisfy the predetermined optical characteristics by the driving unit 9B is not taken in the extraction flow path 66, and flows through either one of the two discarding flow paths 68 and 68. Thereafter, the non-target particle is discharged to the outside through a discarding port 70.

In the second extraction section 4C as described above, the sample inlet 61 corresponds to the sample inlet 42 in the first extraction section 4A, the extraction sample flow path 62 corresponds to the sample flow path 42 in the first extraction section 4A, the sheath liquid inlet 63 corresponds to the sheath liquid inlet 43 in the first extraction section 4A, the sheath liquid flow path 64 corresponds to the sheath liquid flow path 44 in the first extraction section 4A, the main flow path 65 corresponds to the main flow path 45 in the first extraction section 4A, the extraction flow path 66 corresponds to the extraction flow path 46 in the first extraction section 4A, the pressure chamber 67 corresponds to the pressure chamber 47 in the first extraction section 4A, the discarding flow path 68 corresponds to the discarding flow path 48 in the first extraction section 4A, and the discarding port 70 corresponds to the discarding port 49 in the first extraction section 4A. The configurations thereof in the second extraction section 4C are the same as those in the first extraction section 4A. In addition, the irradiation unit 7B corresponds to the irradiation unit 7A in the first extraction section 4A, the light detection unit 8B corresponds to the light detection unit 8A in the first extraction section 4A, and the driving unit 9B corresponds to the driving unit 9A in the first extraction section 4A. The structures themselves thereof in the second extraction section 4C are the same as those in the first extraction section 4A.

However, in the second extraction section 4C, the irradiation unit 7B, the light detection unit 8B, the driving unit 9B, the extraction flow path 66, and the pressure chamber 67 correspond to the second extraction unit of the present technology, and the same function as the second extraction unit 12 of the particle extraction apparatus 1 illustrated in FIG. 1 is exhibited. That is, in the second extraction section 4C, only a target particle is extracted from an extraction sample.

The microchip 4 configured as described above includes three substrate layers. The sample flow path 42, the sheath liquid flow 44, the main flow path 45, the extraction flow path 46, the pressure chamber 47, the discarding flow path 48, the sample flow path 62, the sheath liquid flow 64, the main flow path 65, the extraction flow path 66, the pressure chamber 67, the extraction sample flow path 51, the stirring flow path 55, and the discharge flow path 53 are formed by a substrate layer $a_1$ as a first layer and a substrate layer $a_2$ as a second layer (see FIG. 12).

Meanwhile, the sample inlet 41, the extraction sample flow path 51, the storage flow path 68, and the discarding port 70 are formed by the substrate layer $a_2$ as the second layer and a substrate layer $a_3$ as a third layer.

This microchip 4 can be constituted by bonding substrate layers in which the main flow path 45 and the like are formed.

The main flow path 45 and the like can be formed in the substrate layers by injection molding of a thermoplastic resin using a die. As the thermoplastic resin, a plastic conventionally known as a material of a microchip, such as polycarbonate, a polymethylmethacrylate resin (PMMA), cyclic polyolefin, polyethylene, polystyrene, polypropylene, polydimethylsiloxane (PDMS), or cycloolefin polymer, can be adopted.

As described above, in the microchip 4 according to the present technology, the particle interval in the extraction sample is preferably returned to a random state by compressing and relaxing the stirring flow path 55 with the stirring unit 52. Therefore, the substrate layer $a_1$ with which each of the rollers 53 of the stirring unit 52 is in contact preferably includes a relatively soft resin, and examples thereof include polydimethylsiloxane (PDMS).

Note that the layer structure of the substrate layer of the microchip 4 is not limited to three layers.

The microchip 4 according to the present technology as described above includes the first extraction section 4A and the second extraction section 4C, includes a plurality of components for performing extraction, and therefore can extract a target particle at high speed with high purity. In addition, the microchip 4 can perform an extraction operation superimposed by the first extraction section 4A and the second extraction section 4C, and is not configured so as to simply dispose a plurality of extraction mechanisms. Therefore, an increase in size of the microchip and an increase in cost can be avoided as much as possible.

Furthermore, by setting the detection number λ of a whole sample per unit time in the first extraction section 4A such that the recovery ratio $Y_{Cascode}$ is equal to or higher than the final desired recovery ratio Ys of a target particle, the microchip 4 according to the present technology can extract the target particle with higher purity.

<5. Particle Extraction Method According to First Embodiment>

The present technology also provides a particle extraction method for extracting a target particle.

Figure 14:
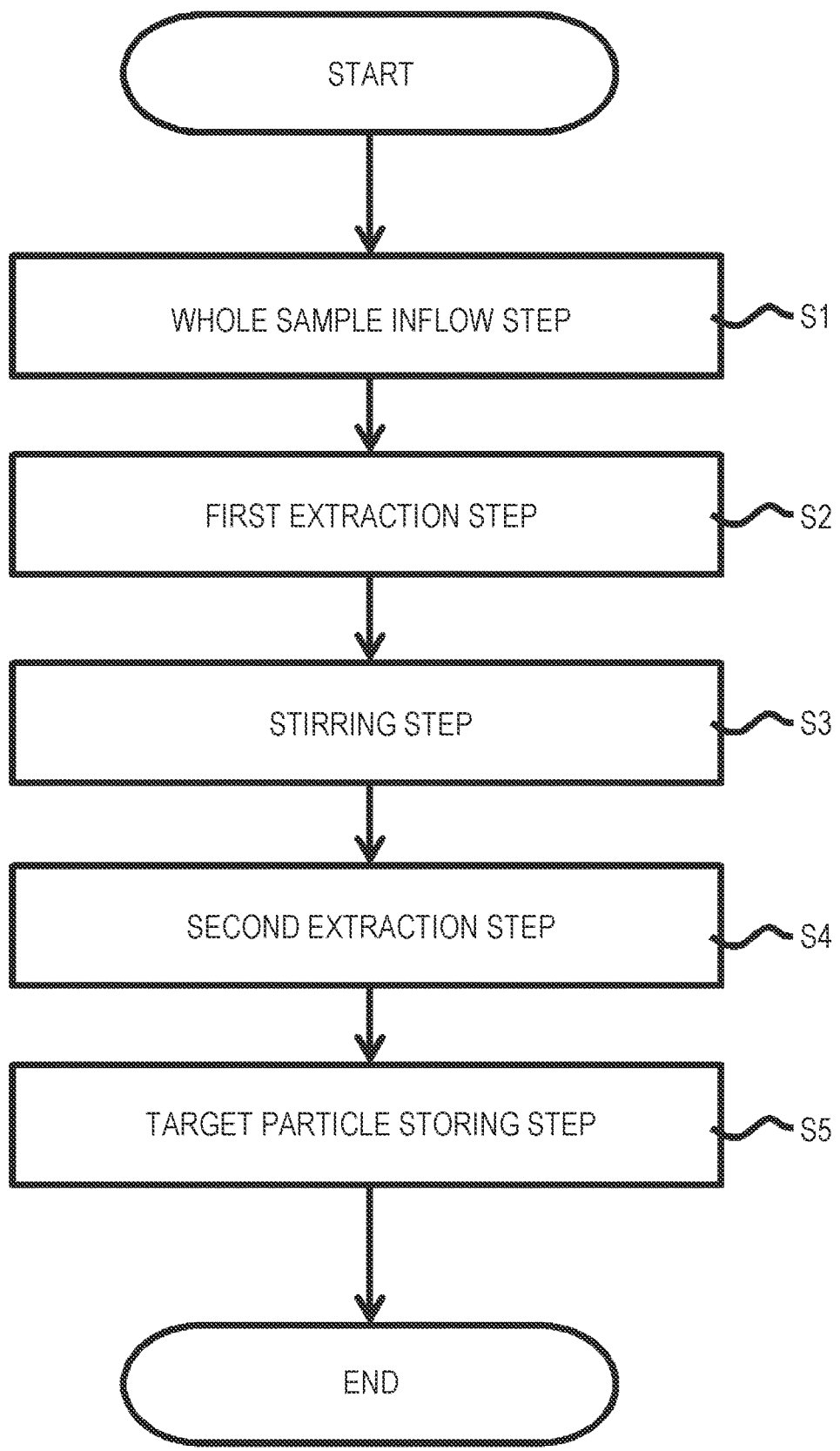
FIG. 14 is a flowchart illustrating a particle extraction method of a first embodiment according to the present technology.

FIG. 14 is a flowchart of a particle extraction method according to a first embodiment.

The method includes at least a first extraction step S2 and a second extraction step S4, and may include a whole sample inflow step S1, a stirring step S3, and a target particle storing step S5 as necessary. Each of the steps will be described below in accordance with the order in which the steps are performed.

(1) Whole Sample Inflow Step

The particle extraction method according to the present technology may include the whole sample inflow step S1 for allowing a whole sample containing a target particle to flow into the particle extraction apparatus 1 illustrated in FIG. 1, for example.

A method for allowing a whole sample to flow into the particle extraction apparatus 1 is not particularly limited. For example, a method for compressing and relaxing a flow path through which the whole sample flows using the liquid feeding unit 16 and allowing the whole sample in the housing unit 14 to flow into the particle extraction apparatus 1 is considered.

(2) First Extraction Step

The whole sample that has flowed into the particle extraction apparatus 1 is subjected to an extraction operation by, for example, the first extraction unit 11 in the particle extraction apparatus 1 illustrated in FIG. 1.

In the first extraction step S2, as in the first extraction unit 11, an extraction sample containing a target particle is extracted without performing abort processing.

Specifically, a sheath flow in which a laminar flow of the whole sample is sandwiched between sheath liquid laminar flows is formed, and extraction is performed using a flow cytometry principle.

That is, as in the first extraction unit 11, a target particle in the sheath flow is irradiated with light to detect fluorescence and/or scattered light generated from the target particle, and only an extraction sample containing the target particle exhibiting predetermined optical characteristics is separated.

In this first extraction step S2, as in the first extraction unit 11, a detection number λ of a whole sample per unit time is preferably set within a range satisfying the following Mathematical Formula 35.

[Mathematical Formula 35]
$$Y_{Cascode} = R \cdot \frac{1 + \lambda_T T_P/2}{1 + \lambda_T(T_P/2 + T_D)} \cdot R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}} \geq Y_S$$

Note that an extraction method in the first extraction step S1 is not particularly limited, and a known method can be adopted as long as an extraction sample containing a target particle is extracted without performing abort processing.

(3) Stirring Step

The particle extraction method according to the present technology may include a stirring step S3 for stirring an extraction sample extracted in the first extraction step S2.

Specifically, in this stirring step S3, the molecular sample having a particle interval adjusted in the first extraction step S2 is stirred, and the particle interval is in a random state again as in the case of the whole sample.

A stirring method in this stirring step S3 is not particularly limited, and examples thereof include a method for compressing and relaxing a flow path through which an extraction sample flows using a known peristaltic dosing pump.

(4) Second Extraction Step

The particle extraction method according to the present technology includes the second extraction step S4 of extracting only a target particle from the extraction sample extracted in the first extraction step S2.

In the second extraction step S4, as in the first extraction step S2, extraction is performed using a flow cytometry principle. That is, a sheath flow in which a laminar flow of the extraction sample is sandwiched between sheath liquid laminar flows is formed, a target particle in the sheath flow is irradiated with light to detect fluorescence and/or scattered light generated from the target particle, and only a target particle exhibiting predetermined optical characteristics is separated.

In other words, in this second extraction step S4, similar extraction to the second extraction unit 12 included in the particle extraction apparatus 1 illustrated in FIG. 1 is performed.

(5) Target Particle Storing Step

The particle extraction method according to the present technology may include the target particle storing step S5 for storing a target particle as necessary.

In this target particle storing step S5, the target particle extracted in the second extraction step S4 is stored.

A method for storing a target particle is not particularly limited, and a known method can be adopted in consideration of a storage environment suitable for the target particle and the like. In a case where the target particle is a cell, for example, in the storing step S5, temperature adjustment suitable for storing the cell, culture, and the like may be applied.

The particle extraction method according to the present technology is completed by completion of the target particle storing step S5.

The particle extraction method according to the present technology includes the first extraction step S1 and the second extraction step S2, includes a plurality of components for performing extraction, and therefore can extract a target particle at high speed with high purity.

In addition, by setting the detection number λ of a whole sample per unit time in the first extraction step S1 such that the recovery ratio $Y_{Cascode}$ is equal to or higher than the final desired recovery ratio Ys of a target particle, the particle extraction method according to the present technology can extract the target particle with higher purity.

<6. Particle Extraction Method According to Second Embodiment>

A second embodiment of the particle extraction method according to the present technology will be described with reference to FIG. 15.

In the particle extraction technology of the present disclosure, in a case where a ratio of a target particle in a whole sample is lower than a predetermined threshold value, the first extraction step S1 and the second extraction step S4 are preferably performed in a cascade manner (hereinafter referred to as "cascade method"). Meanwhile, in a case where the ratio of a target particle in a whole sample is higher than the predetermined threshold value, the first extraction step S1 and the second extraction step S4 are suitably performed in parallel for performing extraction at high speed (hereinafter referred to as "parallel method").

Therefore, the present technology also provides a particle extraction method capable of switching between the cascade method and the parallel method depending on a ratio of a target particle in a whole sample.

Figure 8:
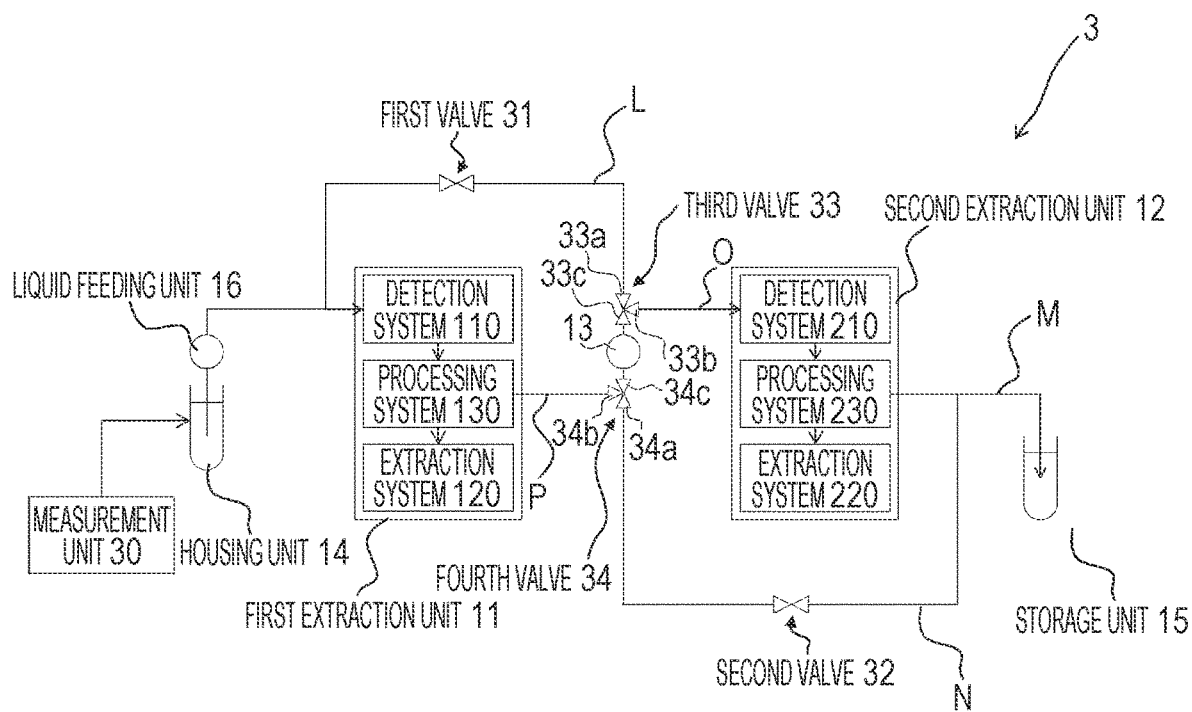
FIG. 8 is a schematic conceptual diagram schematically illustrating a concept of a third embodiment of the particle extraction apparatus according to the present technology.
Figure 9:
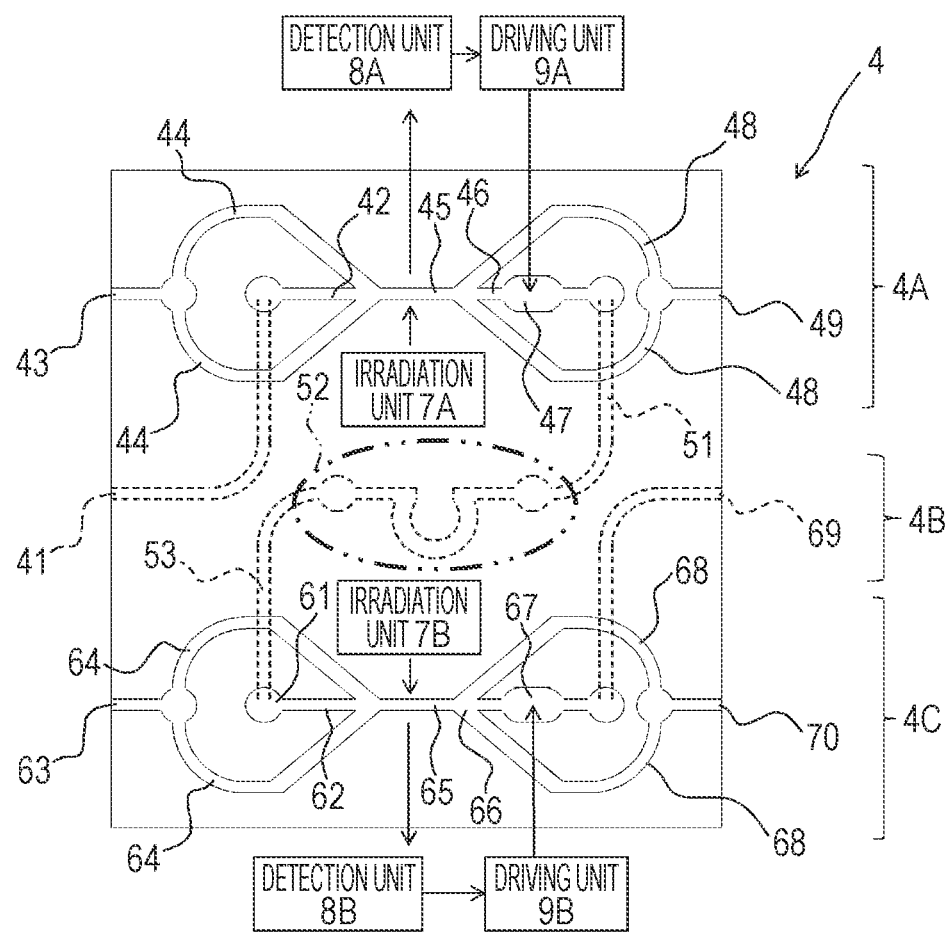
FIG. 9 is a schematic conceptual diagram schematically illustrating a concept of a first embodiment of a particle extraction microchip according to the present technology.

The method relates to a particle extraction method using the particle extraction apparatus 3 illustrated in FIG. 8.

Figure 15:
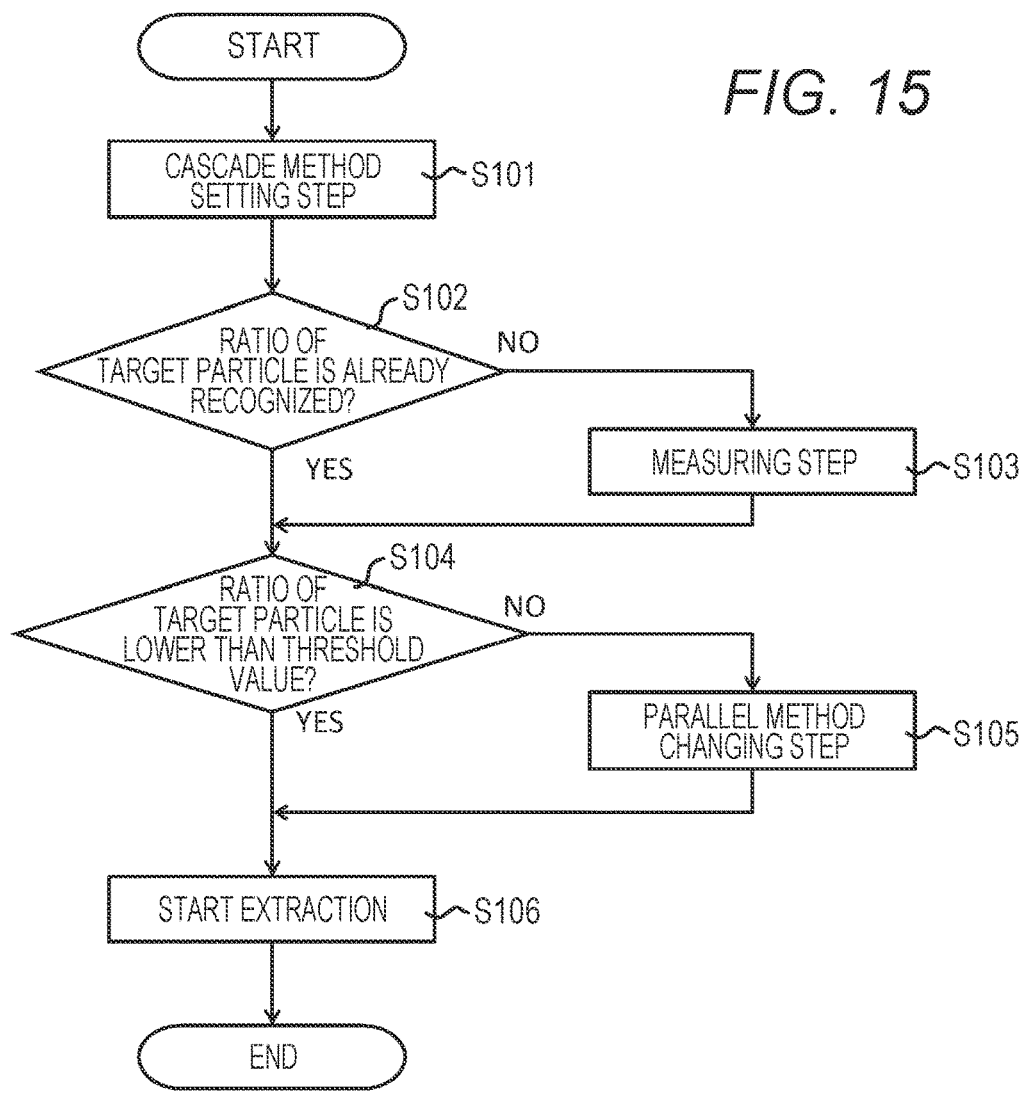
FIG. 15 is a flowchart illustrating a particle extraction method of a second embodiment according to the present technology.

Note that FIG. 15 is a flowchart illustrating an extraction switching step in the particle extraction method according to the second embodiment.

In this particle extraction method, first, the first extraction unit 11 and the second extraction unit 12 are set in a state of being subordinately connected (cascade method setting step S101).

Then, it is determined whether or not a user recognizes a ratio of a target particle in a whole sample (S102). If the user does not recognize the ratio (NO in S102), the process proceeds to a target particle ratio measuring step S103.

In this measuring step S103, the whole sample is allowed to flow into the first extraction unit 11, and a ratio of a target particle is measured using the detection system 110 and the processing system 130 in the first extraction unit 11. Note that a method for measuring a target particles is not particularly limited, and a known method can be used.

Then, when the ratio of a target sample in a whole sample is recognized (YES in S102), it is determined whether or not the ratio of the target particle is lower than a predetermined threshold value (S104).

Here, as described above, in the cascade method, the detection number λ of a whole sample per unit time in the first extraction unit 11 is preferably set within a range satisfying the following Mathematical Formula 36.

[Mathematical Formula 36]
$$Y_{Cascode} = R \cdot \frac{1 + \lambda_T T_P/2}{1 + \lambda_T (T_P/2 + T_D)} \cdot R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}} \geq Y_S$$

Meanwhile, in a case of the parallel method, the detection number λ of a whole sample per unit time in each of the extraction units 11 and 12 is preferably set such that the recovery ratio $Y_{Parallel}$ by the extraction units 11 and 12 is equal to or higher than the final desired recovery ratio Ys of a target particle as expressed by the following Mathematical Formula 37.

[Mathematical Formula 37]
$$Y_{Parallel} = R \cdot \frac{M + \lambda_T T_P/2}{M + \lambda_T(T_P/2 + T_D) + M \cdot (1 - e^{-\lambda_U T_P/M})/e^{-\lambda_U T_P/M}} \geq Y_S$$

From the above, in a case where a maximum event rate satisfying Mathematical Formula 36 is represented by "$\lambda_{Parallel\_max}$" and a maximum event rate satisfying Mathematical Formula 35 is represented by "$\lambda_{Cascode\_max}$", the threshold value as a switching reference between the cascade method and the parallel method is represented by a target particle ratio at which the recovery ratio $Y_{Parallel}$ in the cascade method and the recovery ratio $Y_{Cascode}$ in the parallel method are equal to each other as expressed by the following Mathematical Formula 38.

$$\lambda_{Parallel\_max} = \lambda_{Cascode\_max}$$ [Mathematical Formula 38]

Then, in the determination step S104, if it is determined that the ratio of a target particles in a whole sample is lower than the threshold value (NO in S104), the following Mathematical Formula 39 is satisfied, and therefore a change to the parallel method is performed (parallel method changing step S105).

Thereafter, extraction by the first extraction unit 11 and extraction by the second extraction unit 12 are started (S106).

$$\lambda_{Parallel\_max} \geq \lambda_{Cascode\_max} \qquad \text{[Mathematical Formula 39]}$$

In such a case, the detection number λ of a whole sample per unit time in each of the extraction units 11 and 12 is preferably set such that the recovery ratio $Y_{Parallel}$ by the extraction units 11 and 12 is equal to or higher than the final desired recovery ratio Ys of a target particle as expressed by the following Mathematical Formula 40.

[Mathematical Formula 40]
$$Y_{Parallel} = R \cdot \frac{M + \lambda_T T_P/2}{M + \lambda_T (T_P/2 + T_D) + M \cdot (1 - e^{-\lambda_U T_P/M})/e^{-\lambda_U T_P/M}} \geq Y_S$$

Meanwhile, if it is determined in the determination step S104 that the ratio of a target particle in a whole sample is higher than the threshold value (YES in S104), the following Mathematical Formula 41 is satisfied. Therefore, a switching operation is not performed, and extraction by the first extraction unit 11 and extraction by the second extraction unit 12 are started by the cascade method (S106).

$$\lambda_{Parallel\_max} < \lambda_{Cascode\_max} \qquad \text{[Mathematical Formula 41]}$$

In such a case, the detection number λ of a whole sample per unit time in the first extraction unit 11 is preferably set within a range satisfying the following Mathematical Formula 42.

[Mathematical Formula 42]
$$Y_{Cascode} = R \cdot \frac{1 + \lambda_T T_P/2}{1 + \lambda_T (T_P/2 + T_D)} \cdot R \cdot \frac{1 + \lambda_{T2} T_P/2}{1 + \lambda_{T2}(T_P/2 + T_D) + (1 - e^{-\lambda_{U2} T_P})/e^{-\lambda_{U2} T_P}} \geq Y_S$$

The particle extraction method according to the second embodiment as described above can switch between the parallel method and the cascade method, and therefore can extract a target particle with high purity at high speed depending on a ratio of the target particle in a whole sample.

Furthermore, in a case where the cascade method is selected, the particle extraction method according to the second embodiment can extract a target particle at high speed with high purity. In addition, by setting the detection number λ of a whole sample per unit time in the first extraction unit 11 such that the recovery ratio $Y_{Cascode}$ is equal to or higher than the final desired recovery ratio Ys of a target particle, the particle extraction method according to the second embodiment can extract the target particle with higher purity.

Meanwhile, even in a case where the parallel method is selected, the particle extraction method according to the second embodiment can extract a target particle at high speed with high purity. In addition, a plurality of extraction mechanisms is not simply disposed. Therefore, an increase in size of the particle extraction apparatus and an increase in cost can be avoided as much as possible.

Incidentally, in the particle extraction method according to the present technology illustrated in FIG. 15, a ratio of a target particle in a whole sample is measured in the measuring step S103. However, by allowing a small amount of sample to flow in the detection system 110 in advance, the ratio of a target particle in a whole sample may be measured. The measuring step S103 does not have to be included.

Note that the particle extraction apparatus according to the present technology can have the following configurations.

(1)

A particle extraction apparatus including:

a first extraction unit for extracting, from a whole sample containing a target particle, an extraction sample containing the target particle without performing abort processing; and a second extraction unit for subjecting the extraction sample extracted by the first extraction unit to abort processing and extracting only the target particle.

(2)

The particle extraction apparatus according to (1), in which the first extraction unit and the second extraction unit are formed as separate members, and after extraction by the first extraction unit, extraction by the second extraction unit is performed.

(3)

The particle extraction apparatus according to (1), in which the first extraction unit and the second extraction unit are formed as the same member, and after extraction by the first extraction unit, extraction by the second extraction unit is performed.

(4)

The particle extraction apparatus according to (2) or (3), further including a stirring unit for returning a particle interval in an extraction sample extracted by the first extraction unit to a random state.

(5)

The particle extraction apparatus according to any one of (1) to (4), further including:

a measurement unit for measuring the content of a target particle with respect to the whole sample; and an extraction switching unit for switching an extraction operation by the first extraction unit and an extraction operation by the second extraction unit to a parallel operation on the basis of a measurement result by the measurement unit.

In addition, the particle extraction method according to the present technology can have the following configurations.

(6)

A particle extraction method including:

a first extraction step of extracting, from a whole sample containing a target particle, an extraction sample containing the target particle without performing abort processing; and a second extraction step of subjecting the extraction sample extracted by the first extraction unit to abort processing and extracting only the target particle.

(7)

The particle extraction apparatus according to (6), further including a stirring step of returning a particle interval in the extraction sample to a random state after the first extraction step is performed.

(8)

The particle extraction apparatus according to (6) or (7) further including an extraction switching step of performing the first extraction step and the second extraction step in parallel on the basis of a ratio of a target particle with respect to the whole sample.

EXAMPLES

Hereinafter, the present technology will be described in more detail on the basis of Examples. Note that Examples described below exemplify representative examples of the present technology, and the scope of the present technology is not narrowly interpreted by Examples.

As an Example, the inventors of the present application performed performance comparison between a particle extraction apparatus for performing extraction by a cascade method and a particle extraction apparatus for performing extraction by a parallel method.

Specifically, several parameters (parameters 1 to 4) were set on the basis of the above derived mathematical formulas, and performance comparison was performed. An effect of the particle extraction method according to the present disclosure was indicated quantitatively. Results of the performance comparison based on the parameters are illustrated in FIGS. 16 to 19. Here, in each of the drawings, the horizontal axis indicates an event rate, and the vertical axis indicates a yield. Furthermore, in each of the drawings, the one-dot chain line indicates a result of the parallel method, and the two-dot chain line indicates a result of the cascade method.

Figure 16:
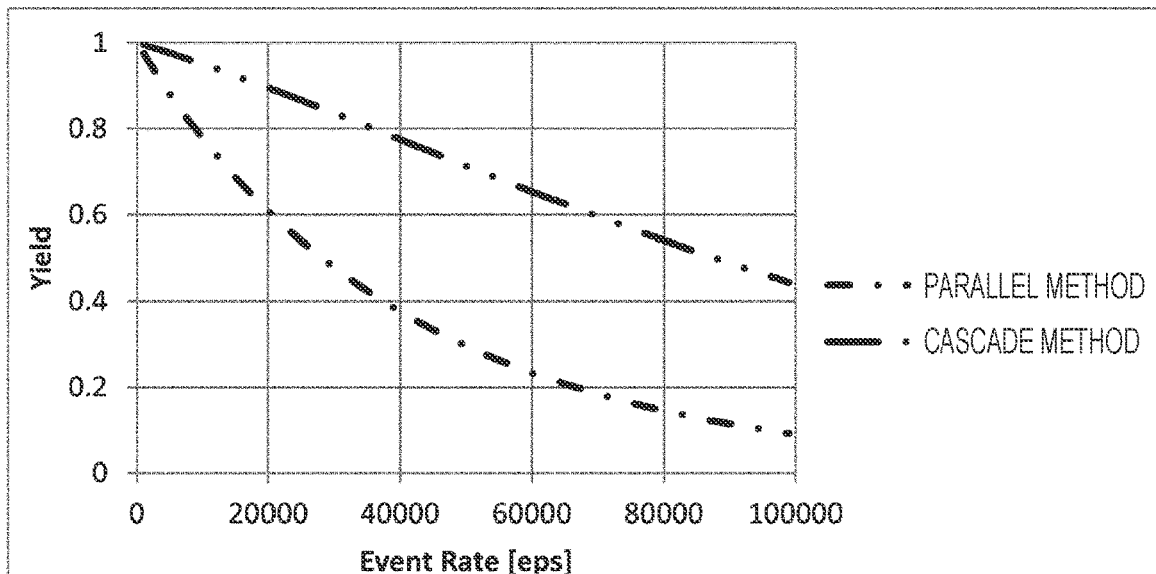
FIG. 16 is a drawing substitution graph illustrating a result of performance comparison between a cascade method and a parallel method based on parameter 1.

FIG. 16 is a drawing substitution graph illustrating a result of performance comparison between the cascade method and the parallel method based on parameter 1. As parameter 1, setting was performed such that R=1.0, r=0.03, $T_p$=50 μs, and $T_D$=75 μs.

As understood from FIG. 16, in the case of parameter 1, it was confirmed that the cascade method could realize a higher yield than the parallel method all the time within a range of event rate=0 to 100 keps.

That is, for example, in a case where yield specification was 80%, it was confirmed that operation was possible at about 35 keps in the cascade method.

Figure 17:
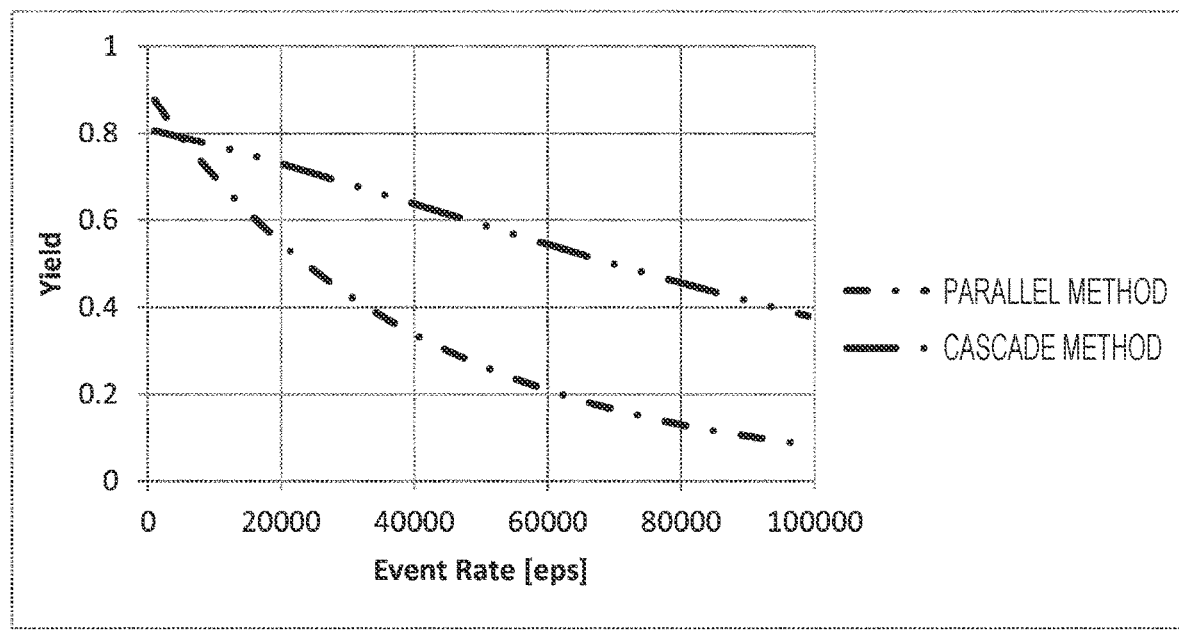
FIG. 17 is a drawing substitution graph illustrating a result of performance comparison between a cascade method and a parallel method based on parameter 2.

FIG. 17 is a drawing substitution graph illustrating a result of performance comparison between the cascade method and the parallel method based on parameter 2. As parameter 1, setting was performed such that R=0.9, r=0.03, $T_p$=50 μs, and $T_D$=75 μs.

As understood from FIG. 17, in the case of parameter 2, it was confirmed that the parallel method could realize a higher yield within a range of event rate=0 to 5 keps and that the cascade method could realize a higher yield within a range of event rate=5 k to 100 keps.

That is, for example, in a case where yield specification was 80%, it was confirmed that extraction by the parallel method was advantageous and that operation was possible at about 4 keps.

Meanwhile, in a case where yield specification was 60% as a slightly low value, it was confirmed that operation was possible at about 48 keps in extraction by the cascade method.

Figure 18:
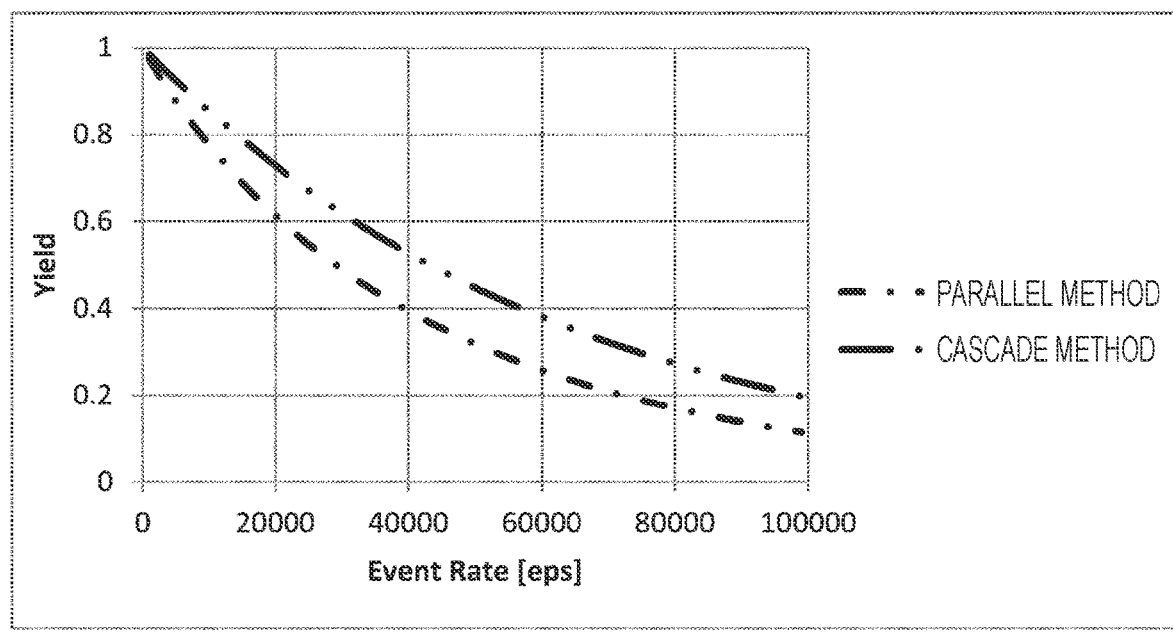
FIG. 18 is a drawing substitution graph illustrating a result of performance comparison between a cascade method and a parallel method based on parameter 3.

FIG. 18 is a drawing substitution graph illustrating a result of performance comparison between the cascade method and the parallel method based on parameter 3. As parameter 3, setting was performed such that R=1.0, r=0.10, Tp=50 μs, and $T_D$=75 μs.

As understood from FIG. 18, in the case of parameter 3, it was confirmed that the cascade method could realize a higher yield than the parallel method all the time within a range of event rate=0 to 100 keps.

That is, for example, in a case where yield specification was 80%, it was confirmed that operation was possible at about 14 keps in the cascade method.

Figure 19:
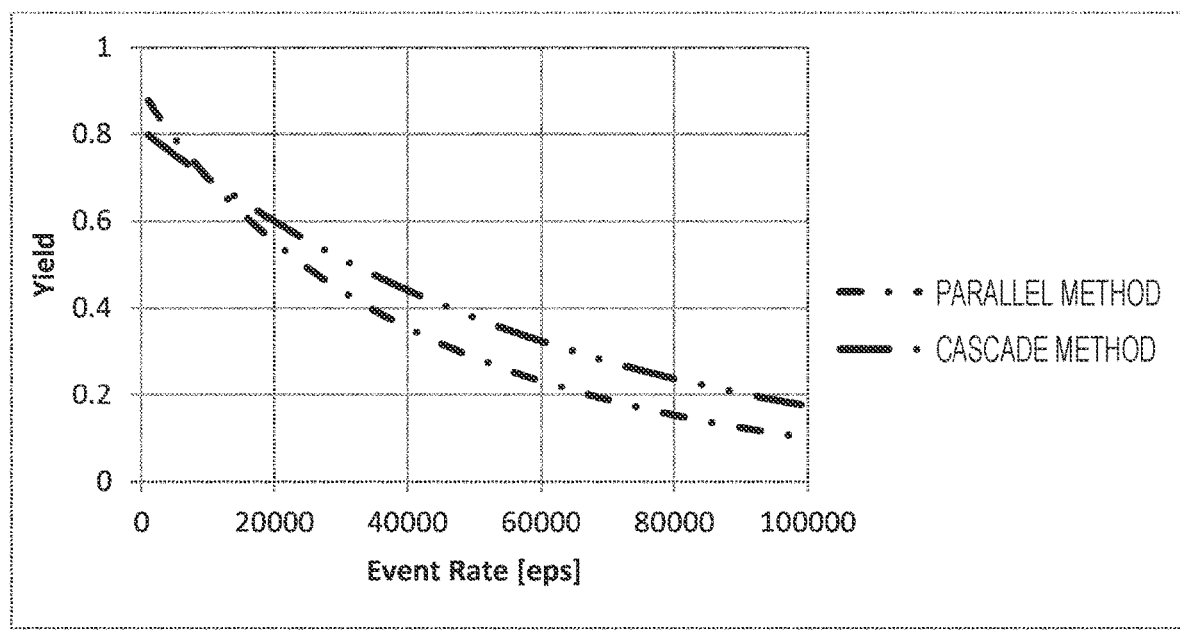
FIG. 19 is a drawing substitution graph illustrating a result of performance comparison between a cascade method and a parallel method based on parameter 4.

FIG. 19 is a drawing substitution graph illustrating a result of performance comparison between the cascade method and the parallel method based on parameter 4. As parameter 4, setting was performed such that R=0.9, r=0.10, $T_p$=50 μs, and $T_D$=75 μs.

As understood from FIG. 19, in the case of parameter 4, it was confirmed that the parallel method could realize a higher yield within a range of event rate=0 to 10 keps and that the cascade method could realize a higher yield within a range of event rate=10 k to 100 keps.

That is, for example, in a case where yield specification was 80%, it was confirmed that extraction by the parallel method was advantageous and that operation was possible at about 5 keps.

Meanwhile, in a case where yield specification was 60% as a slightly low value, it was confirmed that operation was possible at about 20 keps in extraction by the cascade method.

REFERENCE SIGNS LIST 1, 2, 3 Particle extraction apparatus
11 First extraction unit
12 Second extraction unit

The invention claimed is:

1. A particle extraction apparatus comprising:
a first extraction unit configured to extract, from a whole sample containing a target particle, an extraction sample containing the target particle;
a second extraction unit configured to extract the target particle from the extraction sample; and
a liquid feeding section disposed between the first extraction unit and the second extraction unit, wherein the liquid feeding section includes at least one damper,
wherein each of the first extraction unit and second extraction unit are formed in a microchip and wherein the liquid feeding section further comprises a stirring unit configured to return a particle interval in the extraction sample extracted by the first extraction unit to a random state.

2. The particle extraction apparatus according to claim 1, wherein the first extraction unit and the second extraction unit are formed in separate microchips, and after extraction by the first extraction unit, extraction by the second extraction unit is performed.

3. The particle extraction apparatus according to claim 1, wherein the first extraction unit and the second extraction unit are formed in a same microchip, and after extraction by the first extraction unit, extraction by the second extraction unit is performed.

4. The particle extraction apparatus according to claim 1, further comprising:
a measurement unit configured to measure a ratio of a target particle with respect to the whole sample; and
an extraction switching unit configured to switch an extraction operation by the first extraction unit and an extraction operation by the second extraction unit to a parallel operation on the basis of a measurement result by the measurement unit.

5. The particle extraction apparatus according to claim 1, wherein the at least one damper is configured to absorb a pulsating flow generated in the liquid feeding section.

6. The particle extraction apparatus according to claim 1, wherein the at least one damper comprises:
a first damper disposed between the first extraction unit and the stirring unit; and
a second damper disposed between the stirring unit and the second extraction unit.

7. The particle extraction apparatus according to claim 1, further comprising:
   a housing unit coupled to an input of the first extraction unit; and
   a storage unit coupled to an output of the second extraction unit.

8. The particle extraction apparatus according to claim 1, wherein the target particle is a cell.

9. A particle extraction method, comprising:
   extracting, from a whole sample containing a target particle, an extraction sample containing the target particle;
   feeding the extraction sample along a flow path from a first extraction unit to a second extraction unit;
   absorbing a pulsating flow generated in the flow path using a damper;
   extracting, by the second extraction unit only the target particle from the extraction sample; and
   changing a particle interval in the extraction sample, wherein changing the particle interval in the extraction sample comprises returning a particle interval in the extraction sample to a random state.

10. The particle extraction method according to claim 9, wherein extracting only the target particle from the extraction sample comprises subjecting the extraction sample to abort processing.

11. The particle extraction method according to claim 9, wherein:
   the flow path comprises a tubular member, and
   changing a particle interval in the extraction sample comprises compressing and relaxing the tubular member.

12. The particle extraction method according to claim 11, wherein absorbing a pulsating flow generated in the flow path using a damper is performed along the flow path after changing a particle interval in the extraction sample.

13. The particle extraction method according to claim 9, wherein:
   the first extraction unit is formed in a first microchip,
   the second extraction unit is formed in a second microchip, and feeding the extraction sample along a flow path from the first extraction unit to the second extraction unit comprises feeding the extraction sample from the first microchip to the second microchip.

14. The particle extraction method according to claim 9, wherein:
   the first extraction unit and the second extraction unit are formed in a microchip, and
   feeding the extraction sample along a flow path from the first extraction unit to the second extraction unit comprises feeding the extraction sample within the microchip.

* * * * *